US007102732B2

(12) United States Patent
de Jager et al.

(10) Patent No.: US 7,102,732 B2
(45) Date of Patent: *Sep. 5, 2006

(54) METHOD OF MANUFACTURING A DEVICE BY EMPLOYING A LITHOGRAPHIC APPARATUS INCLUDING A SLIDING ELECTRON-OPTICAL ELEMENT

(75) Inventors: Pieter Willem Herman de Jager, Rotterdam (NL); Pieter Kruit, Delft (NL); Arno Jan Bleeker, Westerhoven (NL); Karel Diederick van der Mast, Helmond (NL)

(73) Assignees: Elith LLC, Tempe, AZ (US); Agere Systems Guardian Corp., Orlando, FL (US)

( * ) Notice: Subject to any disclaimer, the term of this patent is extended or adjusted under 35 U.S.C. 154(b) by 261 days.

This patent is subject to a terminal disclaimer.

(21) Appl. No.: 10/425,369

(22) Filed: Apr. 28, 2003

(65) Prior Publication Data

US 2003/0206283 A1 Nov. 6, 2003

Related U.S. Application Data

(63) Continuation of application No. 09/925,723, filed on Aug. 10, 2001, now Pat. No. 6,633,366.

(30) Foreign Application Priority Data

Aug. 14, 2000 (EP) .............................. 00306912

(51) Int. Cl.
*G03B 27/54* (2006.01)
*G03B 27/42* (2006.01)
*G03B 27/32* (2006.01)
*G21K 5/00* (2006.01)

(52) U.S. Cl. ............................ 355/67; 355/53; 355/77; 250/492.2; 250/492.22

(58) Field of Classification Search ............. 250/492.2, 250/492.22, 492.23, 548; 355/53, 55, 67
See application file for complete search history.

(56) References Cited

U.S. PATENT DOCUMENTS

| 2,919,381 A | 12/1959 | Glaser |
| 4,310,776 A | 1/1982 | Duys |
| 4,376,249 A | 3/1983 | Pfeiffer et al. |

(Continued)

FOREIGN PATENT DOCUMENTS

| DE | 41 05 121 A1 | 8/1992 |
| EP | 0 660 370 A2 | 6/1995 |
| EP | 0 660 370 A3 | 2/1997 |
| EP | 0 794 552 A2 | 9/1997 |
| EP | 0 794 552 A3 | 12/1999 |
| WO | WO 01/22469 A1 | 3/2001 |

OTHER PUBLICATIONS

Search Report for European Application No. 01306861.4, dated Sep. 28, 2004.
Search Report for European Application No. 99305532.6, dated Dec. 11, 2000.
Okayama S., "A new type of quadrupole correction lens for electron–beam lithograpy," Nuclear Instruments & Methods in Physics Research A298, 1990, pp. 488–495.
Waskiewicz, W.K. et al, "Electron–Optical Design for the SCALPEL Proof–of–Concept Tool," 1995, SPIE vol. 2522, pp. 13–22.

*Primary Examiner*—Alan Mathews
(74) *Attorney, Agent, or Firm*—Pillsbury Winthrop Shaw Pittman LLP

(57) ABSTRACT

Various options for improving throughput in an e-beam lithography apparatus are described. A slider lens moves in synchronism with the scanning motion of the electron beam.

21 Claims, 27 Drawing Sheets

U.S. PATENT DOCUMENTS

| | | |
|---|---|---|
| 4,514,638 A | 4/1985 | Lischke et al. |
| 4,823,013 A | 4/1989 | van der Mast |
| 4,967,088 A | 10/1990 | Stengl et al. |
| 5,481,164 A | 1/1996 | Langner et al. |
| 5,742,062 A | 4/1998 | Stengl et al. |
| 5,834,783 A * | 11/1998 | Muraki et al. .............. 250/398 |
| 5,952,667 A * | 9/1999 | Shimizu .................. 250/492.2 |
| 6,008,498 A * | 12/1999 | Simizu .................. 250/492.22 |
| 6,064,071 A | 5/2000 | Nakasuji |
| 6,323,499 B1 * | 11/2001 | Muraki et al. ......... 250/492.22 |
| 6,323,937 B1 * | 11/2001 | Sano ........................... 355/69 |
| 6,326,633 B1 * | 12/2001 | Nakasuji .................. 250/492.3 |
| 6,633,366 B1 * | 10/2003 | de Jager et al. ............... 355/67 |

\* cited by examiner $y = 3.632x + 52.693$

— 0.25 mm
--- 0.5 mm
⋯ 0.75 mm
—·— 1.0 mm

XZ

YZ

—— Ra  ---- Rb x10  —·— B (z) [T] x100  ——— A [deg] /5

$BA_{0,i}$ ———
$BA_{2,i}$ ·········
$BB_{0,i}$ —·—·—
$BB_{2,i}$ — — —

$C_i$

METHOD OF MANUFACTURING A DEVICE BY EMPLOYING A LITHOGRAPHIC APPARATUS INCLUDING A SLIDING ELECTRON-OPTICAL ELEMENT

This application is a continuation of application Ser. No. 09/925,723, filed Aug. 10, 2001, now U.S. Pat. No. 6,633,366.

The present invention relates to a lithographic projection apparatus comprising:

a radiation system for supplying a projection beam of radiation;

a support structure for supporting patterning means, the patterning means serving to pattern the projection beam according to a desired pattern;

a substrate table for holding a substrate; and a projection system for projecting the patterned beam onto a target portion of the substrate.

The term "pattering means" as here employed should be broadly interpreted as referring to means that can be used to endow an incoming radiation beam with a patterned cross-section, corresponding to a pattern that is to be created in a target portion of the substrate; the term "light valve" can also be used in this context. Generally, the said pattern will correspond to a particular functional layer in a device being created in the target portion, such as an integrated circuit or other device (see below). Examples of such patterning means include:

A mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

A programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be support structure may be embodied as a frame or table, for example, which may be fixed or movable as required.

A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table; however, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once; such an apparatus is commonly referred to as a wafer stepper. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a scanning apparatus, one or more dies nay be provided in a single scan. Alternatively, each die maybe made up of a plurality of stripes, each printed in a single scan, which are stitched or butted together.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-plantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441 and WO 98/40791, incorporated herein by reference.

SUMMARY OF THE INVENTION

According to an embodiment of the present invention there is provided a lithographic projection apparatus comprising:

a radiation system for providing a projection beam of radiation;

a support structure for supporting patterning structure, the patterning structure serving to pattern the projection beam according to a desired pattern;

a substrate table for holding a substrate;

a projection system for projecting the patterned beam onto a target portion of the substrate in a scanning motion; characterized in that at least one of said radiation system and said projection system comprises a sliding electron-optical element for generating an electromagnetic field for acting on said projection beam such that the optical axis of said electromagnetic field is displaced in at least one direction perpendicular to said axis in synchronism with said scanning motion.

Because the electron-optical element scans with the projection beam, the electron-optical element need only generate fields over the volume traversed by the projection beam at a given moment, rather than over the whole volume traversed during a scanning motion. The fields can therefore be generated more accurately and several beamlets can be passed simultaneously. Further advantages of the invention are described in the following text.

According to a second embodiment of the invention there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized by:

means for generating a magnetic field in the vicinity of the source of said charged particle beam to impart an angular velocity component to off-axis charged particles emitted from said source.

According to a third embodiment of the invention there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized in that said projection system comprises at least four quadrupole lenses.

According to a fourth embodiment of the present invention, there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized in that:

said projection system comprises a magnetic field generator for generating a magnetic field in the vicinity of the mask, of the substrate and of the beam path from mask to substrate, said magnetic field being substantially parallel to said beam path and increasing in strength from said mask to said substrate.

According to a fifth embodiment of the invention there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized in that:

said projection system comprises at least two electromagnets, wherein the electromagnets nearest the mask and substrate have no pole pieces adjacent the mask and substrate respectively.

According to a sixth embodiment of the present invention there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized in that:

said projection system has a length of less than about 350 mm, preferably less than about 320 mm.

According to a seventh embodiment of the present invention there is provided a lithographic projection apparatus for imaging a mask pattern in a mask onto a substrate, the apparatus comprising:

an illumination system constructed and arranged to supply a projection beam of charged particles;

a first object table provided with a first object holder constructed to hold a mask;

a second object table provided with a second object holder constructed to hold a substrate; and a projection system constructed and arranged to image an irradiated portion of the mask onto a target portion of the substrate; characterized in that said projection system comprises an electromagnetic system functioning as imaging lenses and an electrostatic system for varying the beam energy in the projection system.

BRIEF DESCRIPTION OF THE DRAWINGS

The present invention and its attendant advantages will be described below with reference to exemplary embodiments and the accompanying schematic drawings, in which.

In the various drawings, like parts are indicated by like references.

DETAILED DESCRIPTION

In a lithographic apparatus the size of features that can be imaged onto the wafer is related to the wavelength of the projection radiation. To produce integrated circuits with a higher density of devices, and hence higher operating speeds, it is desirable to be able to image smaller features. While most current lithographic projection apparatus employ ultraviolet light generated by mercury lamps or excimer lasers, it has been proposed to use charged particle, e.g. electron and ion, beams.

Throughput is one of the most critical factors for the success of a lithography device. If the throughput is not high enough then the tool cannot operate cost effectively. Low throughput is a particular problem with existing designs of e-beam lithography apparatus.

The throughput of an e-beam tool is determined by electron optical considerations as well as mechanical (stage) design. Of the optical considerations, maximum beam current at given resolution together with pattern coverage and resist sensitivity determine the exposure time. Stage parameters such as acceleration and speed determine the stage overhead. In existing e-beam lithography apparatus, the image of a die, or field, is made up of a plurality of stripes which are stitched together. Further, a plurality of dies can be printed on a substrate using a stepping or step-and-scan principle. The main stage overhead is found in the turn-arounds going from one stripe to the next.

The inventors have modeled the dependence of the throughput of e-beam lithography apparatus on various factors. The stage parameters and the other parameters, used to calculate the throughput, are given in the tables below.

Table 1: Stage parameters as used in the throughput model.

TABLE 1

Stage parameters as used in the throughput model.

| | Wafer Stage | Reticle Stage |
|---|---|---|
| Step speed | 0.4 m/sec max | 2.1 m/sec max |
| Acceleration (step and scan) | 10 m/sec² max (1 G) | 52 m/sec² max (~5.2 G) |
| Jerk | 1000 m/sec³ max | 5200 m/sec³ max |
| Settling time | 30 msec | 30 msec |
| Load/unload inc. align | 15 sec | No exchanges |

Table 2: Stage parameters as used in the throughput model.

TABLE 2

System parameters as used in the throughput model.

| | Value |
|---|---|
| Resist sensitivity | 6 µC/cm² |
| Scan overhead | 10% |
| Pattern coverage | 50% |
| Wafer diameter | 300 mm |
| Die size | 25 × 25 mm² |
| Number of dies per wafer | 89 |

Figure 2:
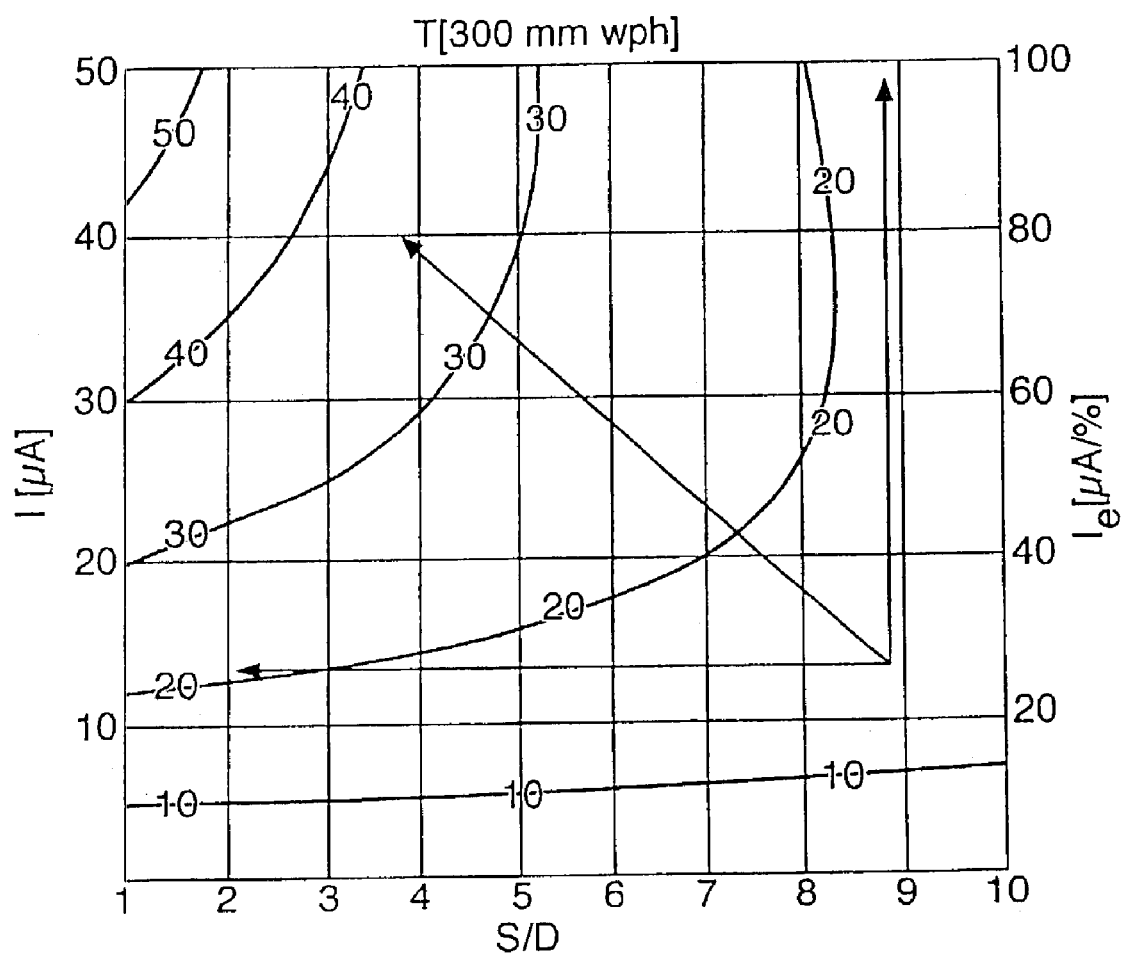
FIG. 2 is a graph showing throughput, T, (300 mm WPH) as function of beam current, I, and the number of strips that have to be stitched to print a full die, in a known e-beam lithographic projection apparatus.

FIG. 2 of the accompanying drawings shows the throughput, T, for beam currents, I, from 1 to 50 µA (or effective beam current $I_e$) and stripe sizes from 25 to 2.5 mm (or from 1 to 10 stripes per die, S/D). Although the curves are shown as smooth, in reality they are not: the graphs are only valid at the integer stripe numbers. However, the representation given gives a better feel for the sensitivity of the throughput on the parameters.

The inventors have determined that with the above parameters the maximum throughput is, for a large part, determined by the stripe size. Eight stripes will never yield more than 20 WPH, five stripes never more than 30 WPH Increasing beam current at a given stripe width can even result in lower throughput. This is because it requires larger stage velocity resulting in larger acceleration and deceleration times. So the overhead time is increased which decreases the throughput.

The performance of the projection system of an e-beam lithography apparatus is largely determined by three contributions to the total blur:

Field curvature

Axial chromatic aberrations

Coulomb interaction

The effect of curvature of field is that the structure is imaged on a curved plane tangent to the image plane on the axis. So there is a circle in the image plane where this effect is zero. If this circle is positioned halfway from the center to the periphery of the image field, the maximum effect on the blur is half the size compared to the case where the circle has been reduced to a point on the optical axis of the system. The following relationship applies:

$$d_{fc} = \frac{1}{2} \cdot C_{fc} \cdot F^2 \cdot \sigma \qquad (1)$$

where $d_{fc}$=FW50 of the curvature of field disc [m]

$C_{fc}$=coefficient of curvature of field [1/m]

F=size of the exposure field [0.25 10⁻³ m]

σ=half opening angle at wafer [6 10⁻³ rad]

For a field curvature at the Gaussian image plane of 52.6 nm, the above equation can be rewritten as:

$$d_{fc}=140.2\ [m^{-1}]F^2 \cdot \sigma \qquad (2)$$

The axial chromatic aberration is caused by the fact that the image plane is different for particles with different energy.

$$d_{Cha} = C_{Cha} \cdot \sigma \cdot \frac{\Delta V}{V_w} \qquad (3)$$

where $d_{Cha}$=FW50 of the chromatic aberration disc [m]
$C_{Cha}$=coefficient of chromatic aberration [m]
$\Delta V$=Full Width at Half Maximum (W value of the energy distribution [eV]
V=beam energy [keV]

The axial chromatic aberration at Gaussian image plane may be, for example, 95.1 nm, in a known e-beam lithography apparatus. This aberration is large because the energy spread is large due to the plasmon losses in the reticle. The above equation can be rewritten as:

$$d_{Cha} = 1.5810^{-5} \, [m] \sigma \qquad (4)$$

Stochastic Coulomb interactions can result in a radial displacement of the individual particles in the beam There are several theories to describe this effect. Here Jansen theory ("Trajectory displacement effect in particle projection lithography systems: Modifications to the extended two-particle theory and Monte Carlo simulation technique", Journal of Applied Physics 84(8), 1998, pp. 4549–4567) is used:

$$d_{lfgil} = C_{lgil} \cdot Rht \cdot Ccht \cdot S4 \cdot \frac{2^{\frac{5}{3}}}{fr4^{\frac{1}{3}} \cdot f\alpha 4} \cdot \frac{(m \cdot amu)^{\frac{2}{3}} \cdot L^2 \cdot I^{\frac{2}{3}}}{(V_c)^{\frac{4}{3}} \cdot (F) \cdot (L \cdot \sigma)^{\frac{1}{3}}} \qquad (5)$$

The total Coulomb interaction blur is partially due to the global space charge effect and partially of a stochastic nature. Here the assumption is made that the scaling laws are identical.

Figure 3:
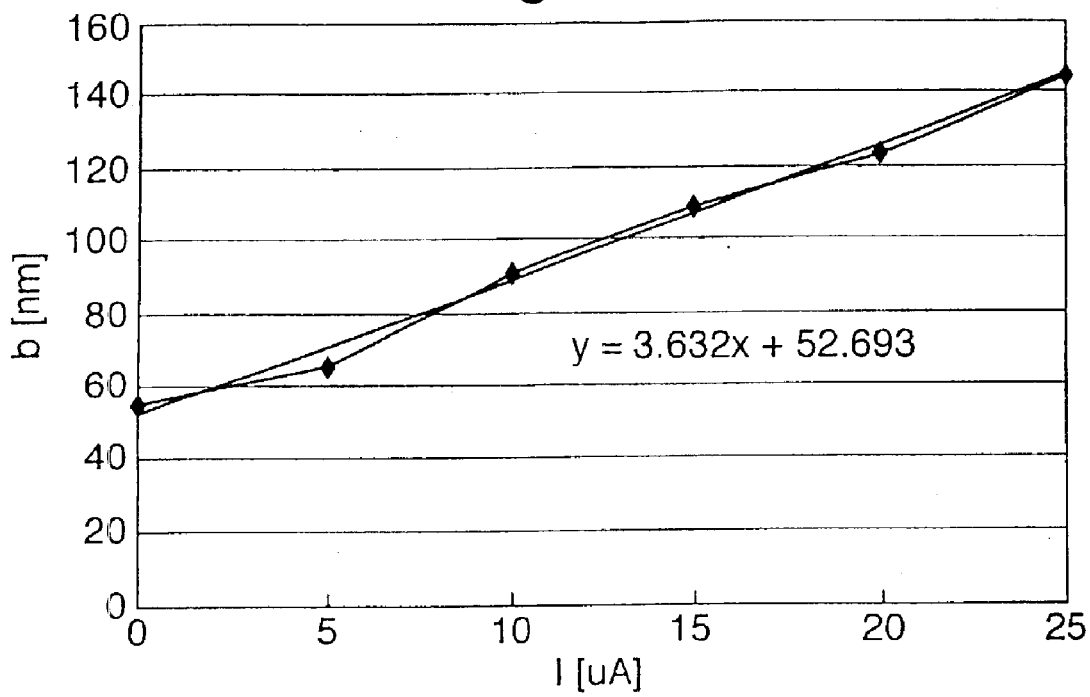
FIG. 3 is a graph showing blur, b, as function of beam current, I, in a known e-beam lithographic projection apparatus.

FIG. 3 of the accompanying drawings shows the sum of these contributions for a known e-beam lithography apparatus. The blur, b, at zero current is the field curvature and the axial chromatic aberration. It can be concluded that optimizing the focus reduces the aberrations to about 50% of their values in the Gaussian image plane. The increase in blur with increasing beam current, I, is due to the Coulomb interaction.

The invention can substantially improve the throughput and extensibility of an e-beam lithography apparatus. Improvements according to the invention both improve the size of the effective field (reduce overhead time) and improve the beam current (illumination time). The first item reduces the exposure time, the second item reduces the stage overheads. The overhead time per wafer is decreased by printing the die during a single scan of the stages. The key element is a slider lens, which makes it possible to move (slide) the exposure field over the full width of the die. Throughput is thereby improved by simultaneously improving the beam current and the effective field.

The beam current can be improved by decreasing the convergence angle, e.g. from 6–8 mrad to less than 1 mrad, and simultaneously increasing the exposure field, e.g. from 0.25×0.25 mm² to 1×1 mm² at the substrate (wafer). This decreases the Coulomb interaction and the chromatic aberration, which is large due to the plasmon losses in the mask (reticle). Further improvement is possible by shortening the projection column, e.g. from about 40 cm to about 32 cm. The result is a beam current of 60 µA at the 100 nm node. With the larger field size of embodiments of the present invention, the reticle layout is modified so that the width of the stripes increases accordingly, e.g. to 4 mm instead of 1 mm.

The Coulomb interaction blur can be isolated from equation 5 above by quadratic subtraction. At 25 µA beam current the Coulomb interaction blur is 133.5 nm in the known e-beam lithography device.

$$d_{lgil} = 7.110^{-9} \cdot \frac{I^{\frac{2}{3}}}{F \cdot \sigma^{\frac{1}{3}}} \qquad (6)$$

Figure 4:
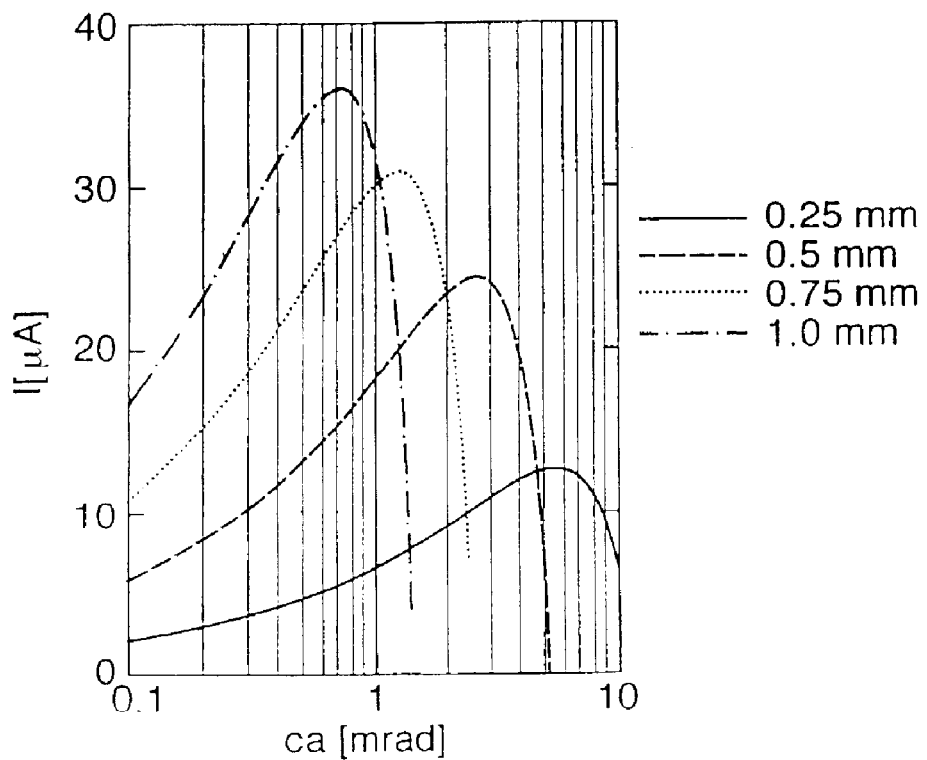
FIG. 4 is a graph showing the effect of exposure field size on allowable beam current.

FIG. 4 of the accompanying drawings shows the total beam current, I, that can be allowed in the projection system as a function of convergence angle, ca, and exposure field size. With a 0.25×0.25 mm² exposure field and 6 mrad convergence angle, the beam current is limited to about 12 µA. With embodiments of the present invention, the exposure field size is enlarged at the wafer to 1×1 mm² and the beam current can then be increased to 35 µA. The reason for this increase is that it is now possible to use a much smaller convergence angle (<1 mrad). This reduces the axial chromatic aberration contribution.

The smaller convergence angle decreases not only the curvature of field and axial chromatic aberration but also all other angle dependent aberrations. The only blur contribution that increases with decreasing convergence angle is the diffraction:

$$d_{dif} = 0.6 \cdot \frac{\lambda}{\sigma} \qquad (7)$$

where $\lambda$=wavelength of the electrons [3.7 $10^{-12}$ m at 100 keV]

This is only 7 nm even at a convergence angle as low as 0.3 mrad.

It is clear that the invention can provide a significant increase in beam current by increasing the exposure field size. Further, the requirements on the speed of the deflection electronics can be decreased by a factor 4.

In principle, distortion increases with the third power of the exposure field size, but in a doublet-like system as used in embodiments of the invention, this can be compensated for.

Several projection systems according to embodiments of the invention can decrease the influence of Coulomb interaction and/or aberrations, as discussed below.

Quadrupole system: this has no an-isotropic aberrations, a large cross-over is possible and it can be combined with a field curvature corrector by applying an electric field at the reticle.

Large cross-over with small convergence angle: in a known e-beam lithography apparatus, a small convergence angle goes together with a small cross-over, this gives a fundamental trade-off between aberrations and Coulomb interaction. Embodiments of the invention de-couple these parameters.

Sliding lens with multibeam: in a sliding lens, several beamlets can be passed simultaneously. Since these beamlets only interfere in a small area, the Coulomb interaction scales with a lower power than the beam current. Therefore the total current can be kept constant while the Coulomb interaction blur is decreased. Even printing at several dies at the same time is potentially possible.

Embodiments of the invention can provide e-beam lithography apparatus meeting the following criteria:

| | |
|---|---|
| 1. Effective field size: | >22 mm on wafer |
| 2: System length: | <400 mm |
| 3. Sub-field size: | 0.25 × 0.25 mm2 on wafer |
| 4. Magnification: | 0.25 |
| 5. Telecentric design: | image shift due to 1 μm wafer height change: <1 nm |
| 6. Cross-overs: | 1 |
| 7. Cross-over position: | Stationary to facilitate contrast aperture |
| 8. Beam energy: | ~100 kV |
| 9. Base resolution: | <30 nm @ ~6 mrad opening angle and 0 current |

The present invention also provides methods of manufacturing semiconductor devices using the lithographic apparatus according to the various aspects of the invention.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of charged particle beams, such as ion beams or electron beams.

Embodiment 1

Figure 1:
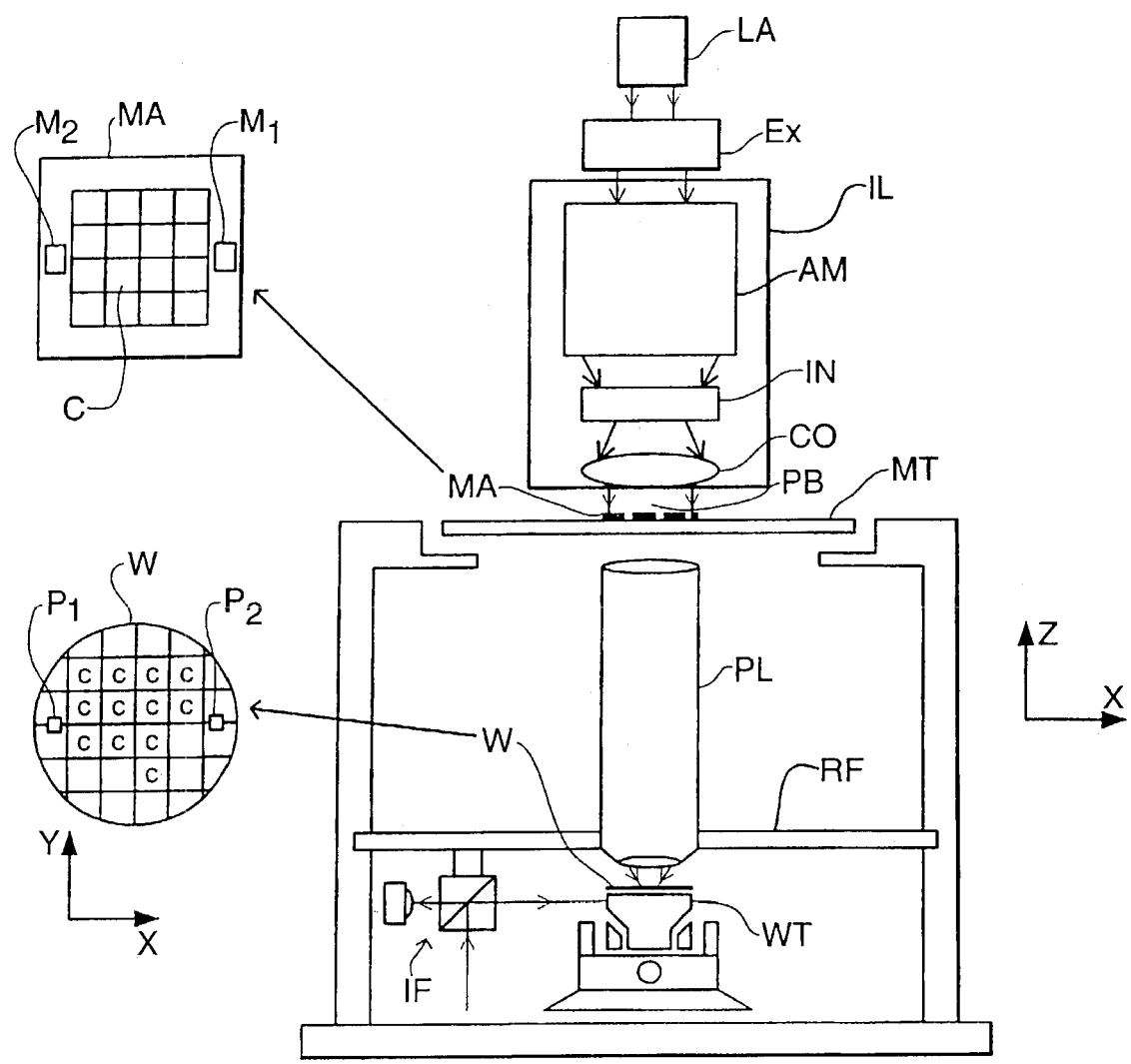
FIG. 1 depicts a lithographic projection apparatus according to a first embodiment of the invention.

FIG. 1 schematically depicts a lithographic projection apparatus according to a particular embodiment of the invention. The apparatus comprises:

a radiation system Ex, IL, for supplying a projection beam PB of radiation (e.g. an electron beam), which in this particular case also comprises a radiation source LA;

a first object table (mask table) MT provided with a mask holder for holding a mask MA (e.g. a reticle), and connected to first positioning means for accurately positioning the mask with respect to item PL;

a second object table (substrate table) WT provided with a substrate holder for holding a substrate W (e.g. a resist-coated silicon wafer), and connected to second positioning means for accurately positioning the substrate with respect to item PL;

a projection system ("lens") PL (e.g. electromagnetic and electrostatic lenses) for imaging an irradiated portion of the mask MA onto a target portion C (e.g. comprising one or more dies) of the substrate W.

As here depicted, the apparatus is of a transmissive type (i.e. has a transmissive mask). However, in general, it may also be of a reflective type, for example (with a reflective mask). Alternatively, the apparatus may employ another kind of patterning structure, such as a programmable mirror array of a type as referred to above.

The source LA (e.g. a thermionic cathode or ion gun) produces a beam of electrons. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired intensity distribution in its cross-section.

It should be noted with regard to FIG. 1 that the source LA maybe within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WI can be moved accurately, e.g. so as to position different target portions C in the path of the beam PB. Similarly, the first positioning means can be used to accurately position the mask MA with respect to the path of the beam PB, e.g. after mechanical retrieval of the mask MA from a mask library, or during a scan. In general, movement of the object tables MT, WT will be realized with the aid of a long-stroke module (course positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed.

The depicted apparatus can be used in two different modes:

1. Instep mode, the mask table MT is kept essentially stationary, and an entire mask image is projected at once (i.e. a single "flash") onto a target portion C. The substrate table WT is then shifted in the x and/or y directions so that a different target portion C can be irradiated by the beam PB;

2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 5:
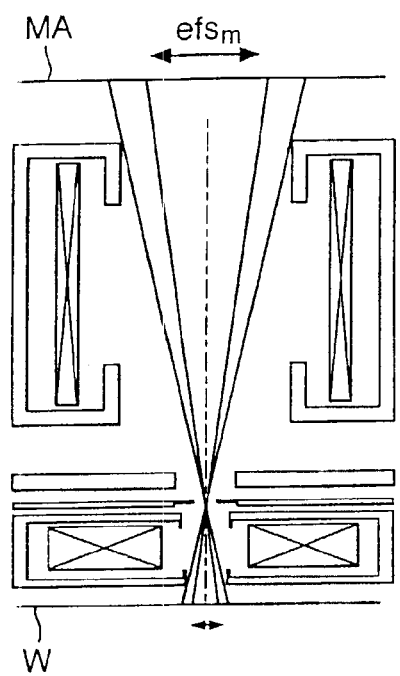
FIG. 5 is a diagram of coils and pole pieces in the projection system of a known e-beam lithographic projection apparatus.
Figure 6:
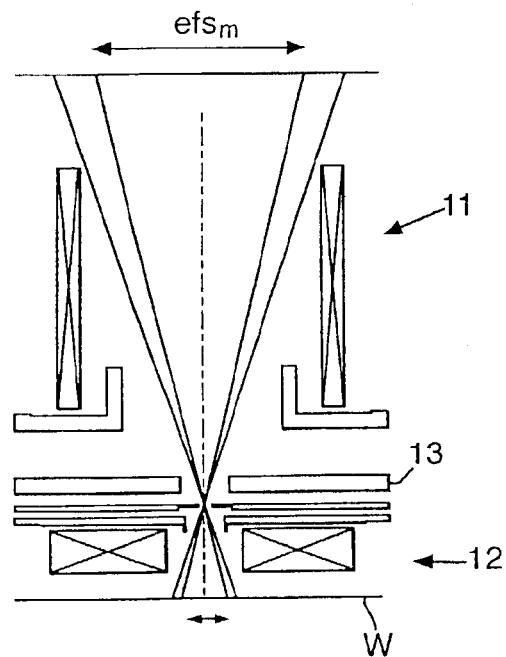
FIG. 6 is a diagram of coils and pole pieces in the projection system of an e-beam lithographic projection apparatus according to a first embodiment of the invention.

In a known e-beam lithography apparatus, the projection system of which is shown in cross-section in FIG. 5, the size of the effective field is limited by the material that is positioned around the beam near the reticle and near the wafer. According to the first embodiment of the invention, the maximum effective field size, $efs_m$, is increased by creating a larger bore in the upper pole piece of the upper lens 11 and in the lower pole piece of lower lens 12. This is schematically shown in FIG. 6. Although only the pole pieces are drawn, a conical shape of the ferrite stack instead of a cylindrical shape can also be employed. According to this embodiment, the effective field is increased by having asymmetric pole pieces in each lens. The system is still symmetric in the aperture to facilitate a full doublet. Field clamps 13 are provided between the upper and lower lens 11, 12.

Embodiment 2

Figure 7:
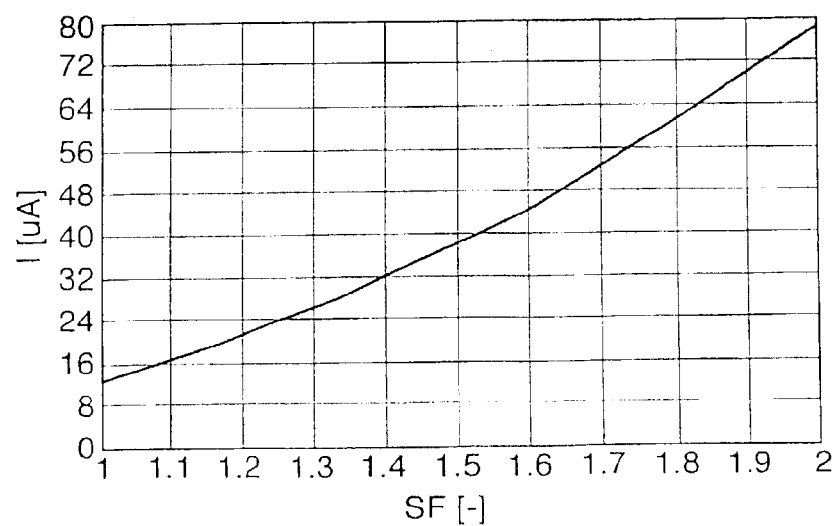
FIG. 7 is a graph showing the effect of shortening the beam column on allowed beam current.
Figure 8:
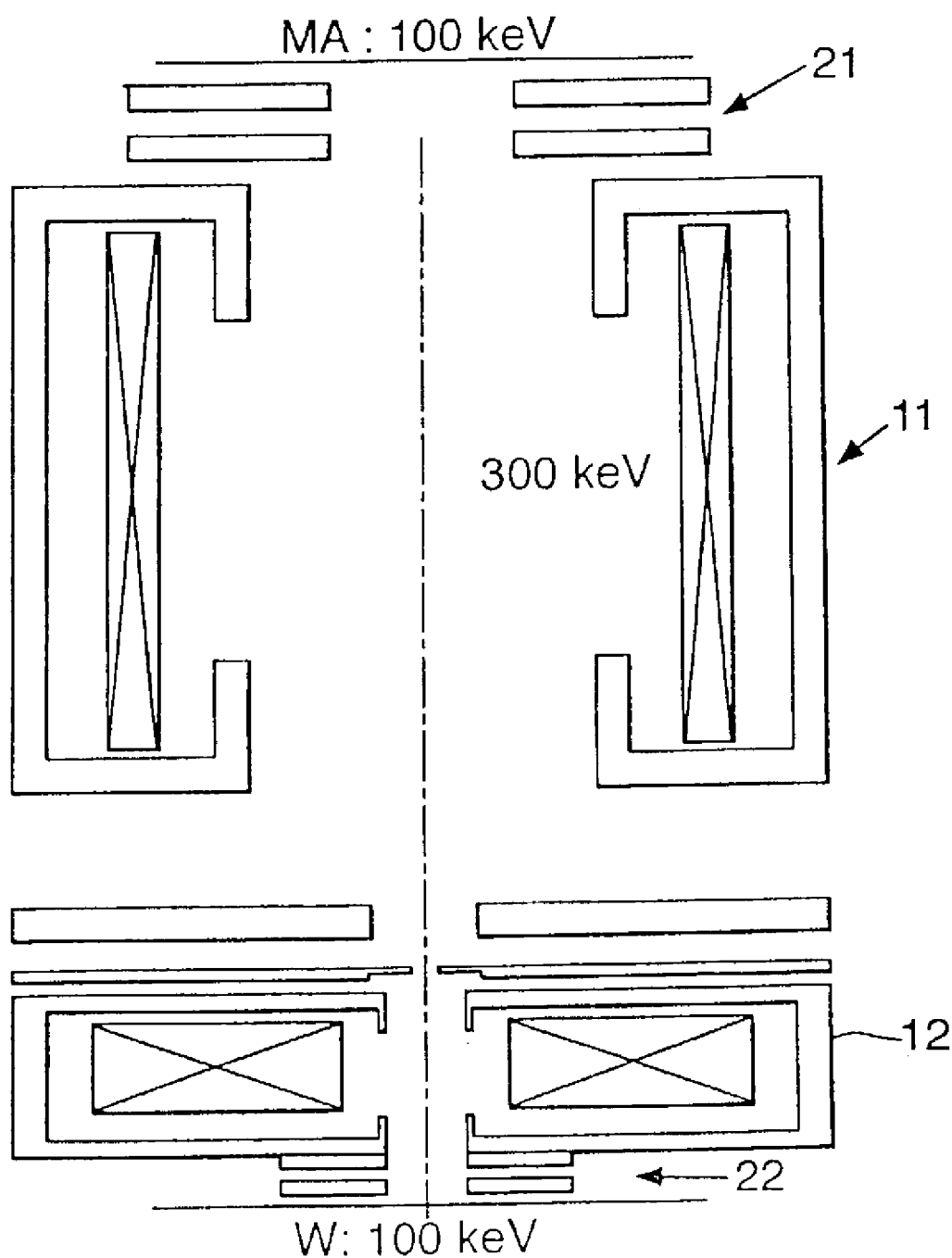
FIG. 8 is a diagram of a combination electrostatic and electromagnetic projection system in a lithographic projection apparatus according to a third embodiment of the invention.

In a second embodiment of the invention, which may be the same as the first except as described below, the allowable beam current is increased by shortening the projection lens system. FIG. 7 shows the increase in allowable beam current, I, compared with a column of 400 mm for various values of the shorten factor, SF. The data for this figure is derived by modeling the effect of a shortened projection system. The modeled aberration coefficients are given below:

tion of electromagnetic imaging lenses and electrostatic accelerating and decelerating optics, as shown in FIG. 8.

The problem with a pure electrostatic system is that it is very hard to create strong electrostatic lenses, this gives a long column. The third embodiment therefore instead provides a combination of electrostatic and magnetic optics: the magnetic optics deliver the lens fields while the electrostatic

TABLE 3

| | | original size | | Length shorten by factor 2 | | Length shorten by factor 2 Balanced rotation angle | |
|---|---|---|---|---|---|---|---|
| | | Isotropic (real part) | Anisotropic (imag. part) | Isotropic (real part) | Anisotropic (imag. part) | Isotropic (real part) | Anisotropic (imag. part) |
| Rotation [rad] | | $2.97 \times 10^{-3}$ | | $5.25 \times 10^{-2}$ | | $5.90 \times 10^{-2}$ | |
| Spherical ab. [mm] | $C_s$ | 114 | | 36.9 | | 44.5 | |
| Coma length [−] | $C_{col}$ | −3.84 | −1.63 | −2.93 | −1.43 | −2.13 | −1.50 |
| Field curv. [mm$^{-1}$] | $C_{fc}$ | 0.144 | | 0.245 | | 0.169 | |
| Astigmatism [mm$^{-1}$] | $C_{as}$ | 0.0364 | 0.0394 | 0.0492 | 0.0787 | 0.0126 | 0.0565 |
| Distortion [mm$^{-2}$] | $C_{di}$ | $1.20 \times 10^{-5}$ | $1.12 \times 10^{-5}$ | $-3.01 \times 10^{-3}$ | $-7.70 \times 10^{-4}$ | $-1.50 \times 10^{-4}$ | $1.03 \times 10^{-4}$ |
| Axial chrom. [mm] | $C_{as}$ | 45.2 | | 23.5 | | 23.4 | |
| Transverse chrom. [−] | $C_{tc}$ | $-6.61 \times 10^{-3}$ | $-1.49 \times 10^{-3}$ | 0.196 | −0.0263 | $1.80 \times 10^{-3}$ | $-2.95 \times 10^{-2}$ |

The results in the first column (original size) and last column (length shorten by factor 2 with balanced rotation angle) give rise to the following scaling laws:

$$d_{fc} \propto \frac{1}{\sqrt{L}} \cdot F^2 \cdot \sigma \quad (7)$$

$$d_{ac} \propto L \cdot \sigma \cdot \frac{\Delta V}{V_w} \quad (8)$$

where L=length of the column [m]
It has been shown above that:

$$d_{cl} \propto L^{\frac{5}{3}} \cdot \frac{I^{\frac{2}{3}}}{F \cdot \sigma^{\frac{1}{3}}} \quad (9)$$

FIG. 7 shows the allowed beam current for a critical dimension of 100 nm as a function of the shorten factor. The data is based on an e-beam lithography apparatus with 0.25×0.25 mm² exposure field and 6 mrad convergence angle.

It can be concluded that a shorten factor of 1.25 increases the allowed beam current by a factor 1.86. The column length in this case is 32 cm.

A shorter column influences the effective field size since the angle at the cross-over increases and there is an earlier onset of the 5$^{th}$ and 7$^{th}$ order aberrations. Assuming that the effective field aberrations scale with this angle, it can be concluded that the effective field size has to be decreased by the same shorten factor as the column length. If an effective field of 6.563 mm can be used (4 strips) with a conventional length column, without significant increase in the aberration, then reducing the column to 32 cm limits the effective field to about 5.3 mm (5 strips). Nevertheless, a net increase in throughput can be achieved through the increased beam current.

Embodiment 3

A third embodiment, which may be the same as the first or second embodiments described above, uses a combinaoptics deliver a variation in beam energy to provide optimum performance in the different parts of the projection system. At the mask MA (reticle) it is desirable to have a high beam energy to reduce chromatic aberration due to plasmon excitations. A high beam energy is also desirable at the cross-over since the Coulomb interaction decreases with increasing beam energy, reducing stochastic blur. However, a low landing energy at the substrate W is desirable since resist sensitivity scales proportionally to beam energy. A low landing energy decreases the required charge to expose the wafer and decreases the deposited energy.

A beam energy of 100 keV in the reticle region and at landing but 300 keV at crossover is desirable. As shown in FIG. 8, this is achieved by providing a set of appropriately charged accelerating plates 21 between the reticle and upper magnetic lens 11 and a set of appropriately charged decelerating plates 22 between the lower magnetic lens 12 and the wafer. The upper and lower lenses 11, 12 form a magnetic doublet.

The areas of accelerating and decelerating can be reasonably short compared to the total column length. Therefore the assumption is made that an impression of the allowed beam current can be obtained by assuming that the Coulomb interaction in the added regions can be neglected.

$$d_{Cl} \propto \frac{I^{\frac{2}{3}}}{V^{\frac{4}{3}}} \quad (10)$$

where I=beam current=15 μA
V=beam energy, conventionally=100 keV; in this embodiment=300 keV The allowable beam current in this embodiment is therefore 135 μA if the same part of the blur can be reserved for Coulomb interaction.

Embodiment 4

In a fourth embodiment of the invention, which may be the same as the first to third embodiments save as described below, the effective field size is increased by arranging for the projection lens, or certain parts of it, to displace in synchronism with the scanning motion of the beam. In this way, rather than needing to generate fields of the required accuracy over the space traversed by the beam in the entire scan, the electromagnetic lens need only be of the size of the beam cross-section at the relevant positions. A larger beam, required for a larger effective field size, can therefore be accommodated.

The idea of a slider lens is that very large effective fields are possible if the axis of the lens moves. This can be done by mechanically moving the lens but a better way is electronic motion of the lens. A lens like this is the key element to minimize the overhead time by reducing the amount of stripes, ultimately to one per die.

Figure 9:
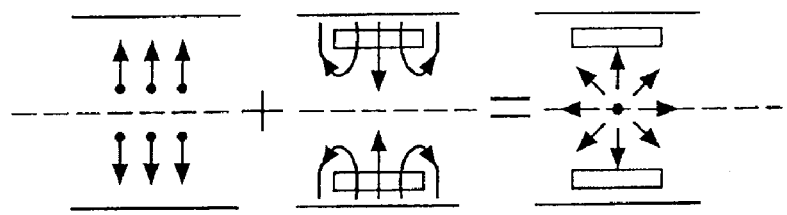
FIG. 9 is a diagram showing how magnetic fields can be added to form a spherical magnetic field.
Figure 10:
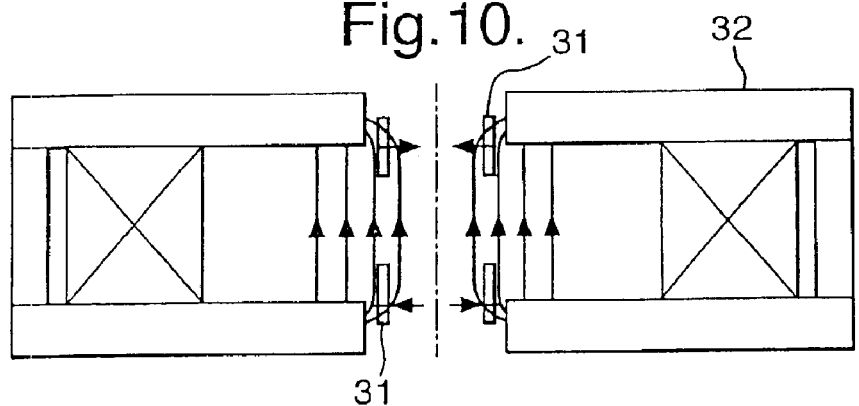
FIG. 10 is sideways cross-sectional view of an electromagnetic slider lens according to a fourth embodiment of the invention.
Figure 11:
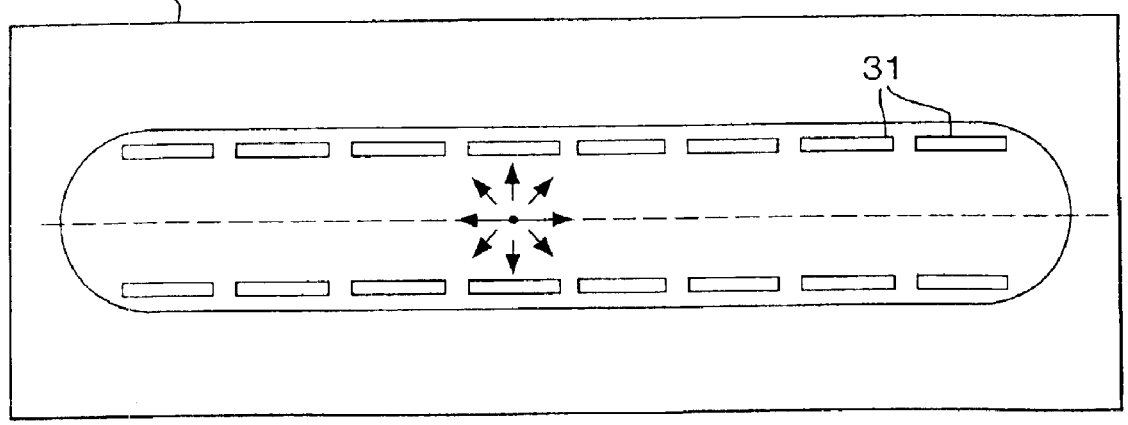
FIG. 11 is a top plan view of the electromagnetic slider lens according to the fourth embodiment of the invention.

A magnetic sliding lens according to the fourth embodiment of the invention is shown in FIGS. 10 and 11 which are respectively a side and a plan view of the magnet system for creating the sliding lens. In this system a round (spherical) lens field is created instead of a quadrupole. Therefore a row of small selectable coils 31 is positioned at each side of the effective field. By changing the excitation of each of these coils in an appropriate sequence synchronized to the scanning movement of the beam, the lens can be moved. FIG. 9 shows how the field of the main (slit) coils 32 and the small coils 31 add to create a functional round lens. The small coils 31 create a quadrupole field (as can be seen in the middle figure). By adding a magnetic field between (left figure) the round lens is created (right figure).

Figure 12:
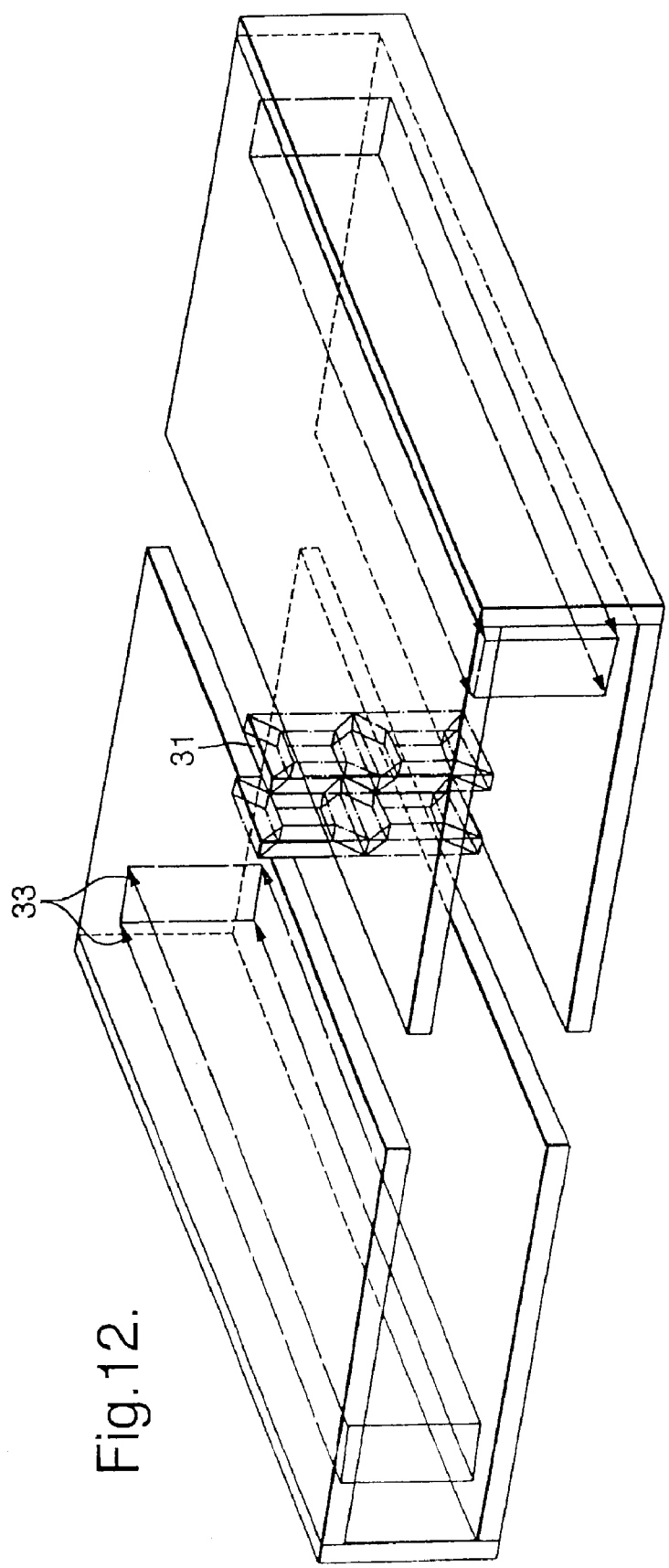
FIG. 12 is a wireframe diagram of the electromagnetic slider lens according to the fourth embodiment of the invention.
Figure 13:
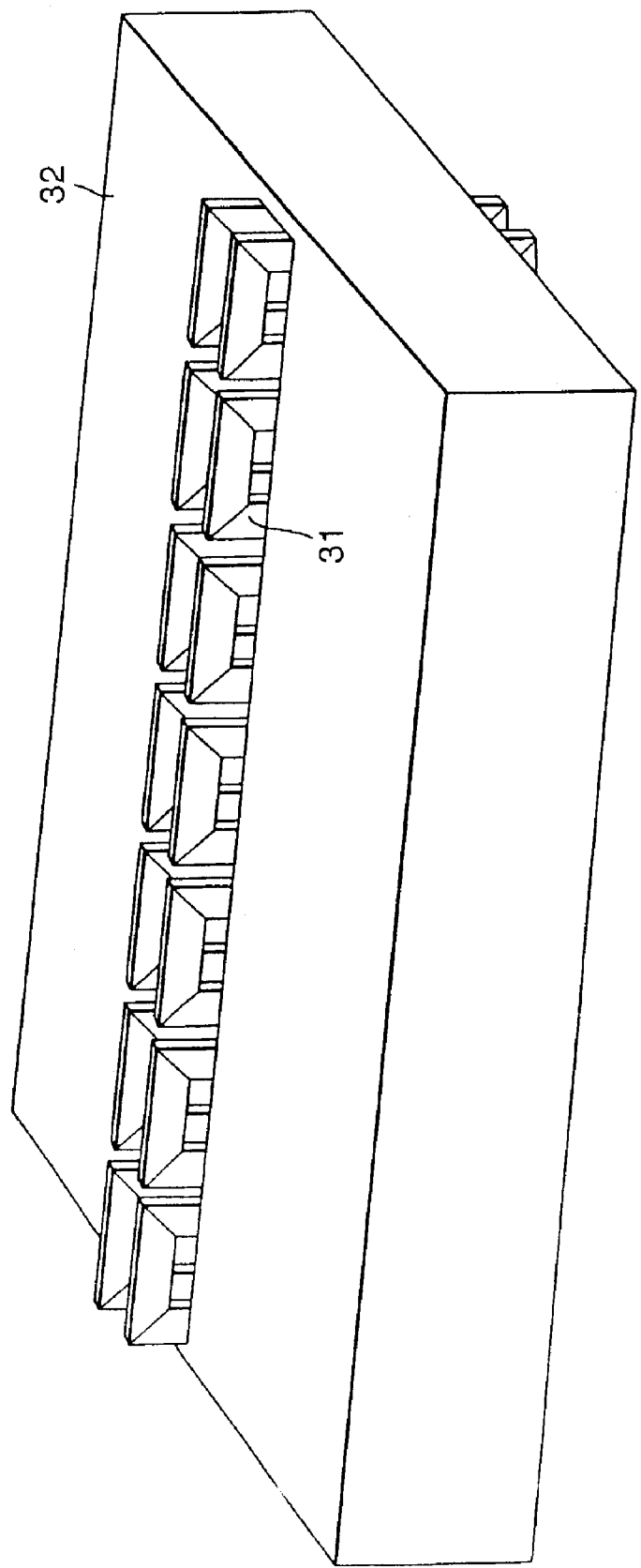
FIG. 13 is a perspective view of the electromagnetic slider lens according to the fourth embodiment of the invention.
Figure 14:
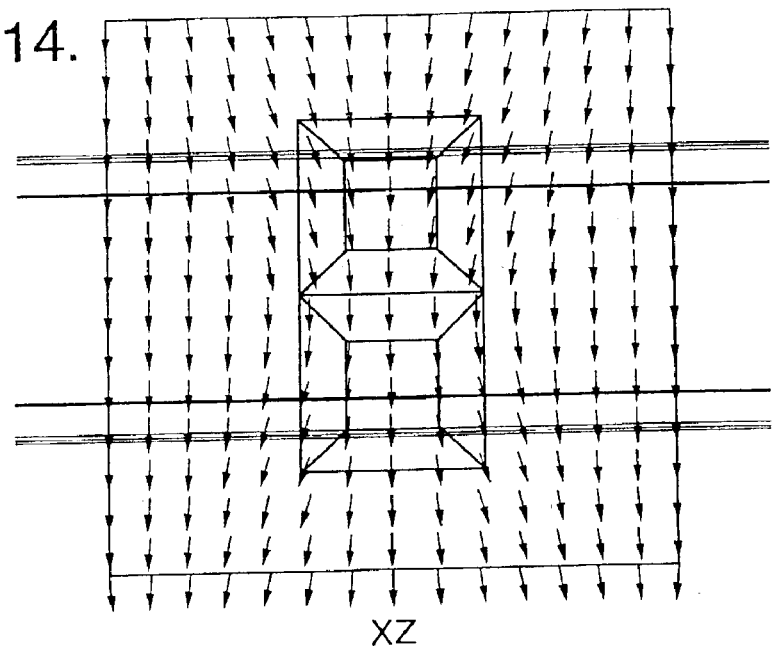
FIG. 14 is a diagram of the magnetic field generated by the electromagnetic slider lens of the fourth embodiment of the invention in the XZ plane.
Figure 15:
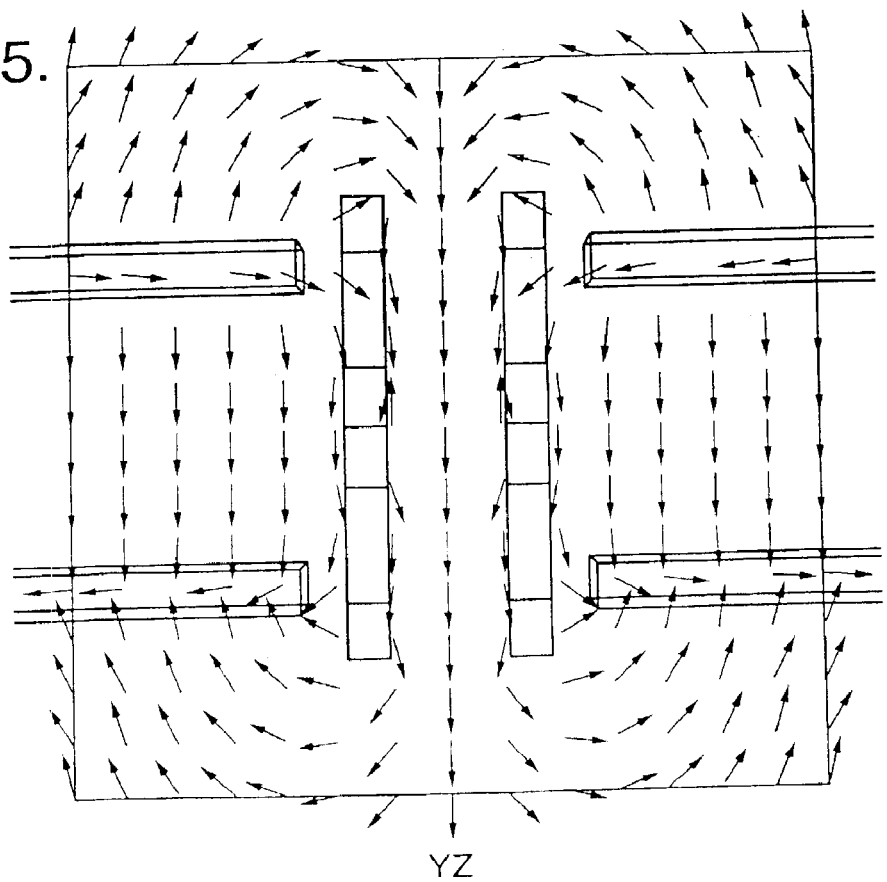
FIG. 15 is a diagram of the magnetic field generated by the electromagnetic slider lens of the fourth embodiment of the invention in the YZ plane.
Figure 16:
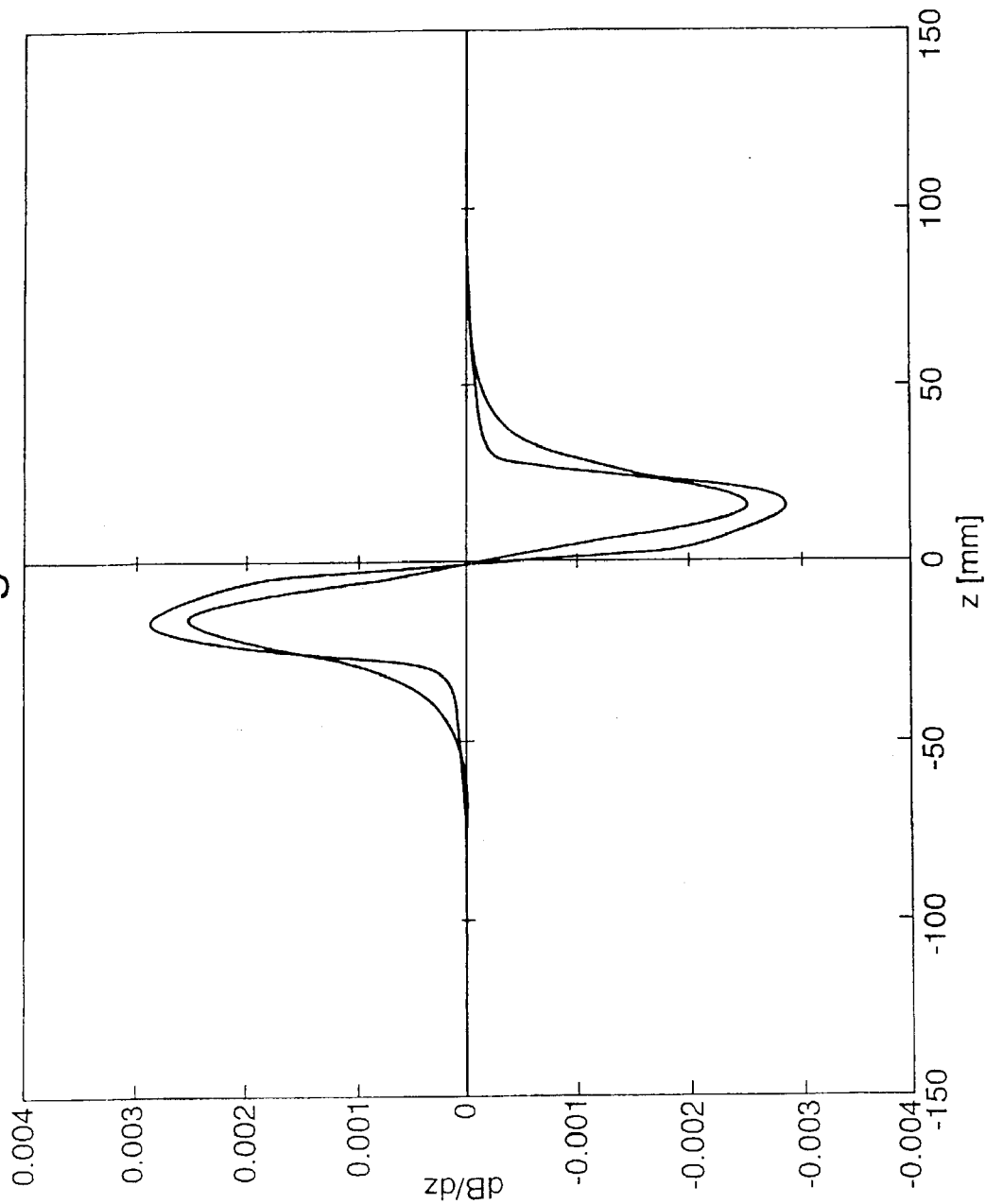
FIG. 16 is a graph of fields and field gradients in the gap generated by the electromagnetic slider lens of the fourth embodiment of the invention.

The performance of this lens has been calculated with the program LORENTZ 3D. FIGS. 12, 14, 15 and 16 show the lens construction and performance results. FIG. 13 illustrates the construction principle; the portion 32 is the coil to create the magnetic field in the gap, which may have 3500 Ampere.turns, in the center the rows with quadrupoles 31 are depicted. These coils may overlap and will generally be greater in number than as shown. FIG. 12 is a wireframe view of a configuration used in numerical simulations. The arrows 33 indicate the current in the highly stigmatic "round" lens. A single set of quadrupole coils 31 is shown in the center. In FIGS. 14 and 15 the magnetic fields in the XZ and YZ planes are indicated by arrows. In FIG. 16, the curve with lower amplitude peaks is the derivative of Bz in the gap (proportional to By from the slits) and the other is By due to the quadrupoles.

Figure 17:
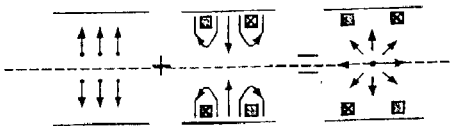
FIG. 17 is a diagram showing how magnetic fields can be added to form a round lens field.
Figure 18:
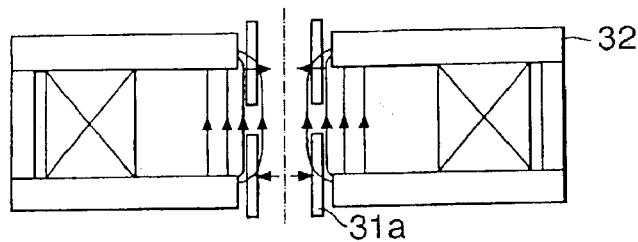
FIGS. 18 and 19 are respectively side and top views of an electromagnetic slider lens according to a first variant of the fourth embodiment.
Figure 19:
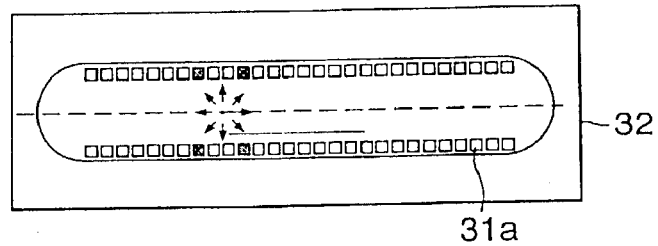

A first variant of the fourth embodiment generates a more accurately "round" lens. The principle of the first variant of the fourth embodiment is shown in FIG. 17 and its construction is shown in FIGS. 18 and 19.

In the first variant of the fourth embodiment, the quadrupole field is generated by two selectable coils 31a on each side of the slit between coils 32. The selectable coils 31a differ from those in the fourth embodiment in that they lie only in the direction orthogonal to the plane of the slit (generally parallel to the direction of propagation of the projection beam) and not along the length of the slit. As shown in FIG. 17, the slit field and the quadrupole field add to generate a round field in the same way as the fourth embodiment. In this and later Figures, shaded selectable coils indicate that the coils are energized while a cross indicates current into the page and no cross current out of the page. To make a more accurate round field, the following equation must be satisfied:

$$\frac{dB_S}{dz} = B_Q \quad (11)$$

where $B_S$ is the slit magnetic field and $B_Q$ the quadrupole field. This equation can be more accurately satisfied with the first variant of the fourth embodiment.

The round lens field can be displaced by applying currents to other coils. Therefore rows of coils are used instead of just four coils. The round lens field can be positioned at any point on the x-axis by applying currents to two sets of neighboring quadrupoles at the same time in such a way that the total current used is identical to the current needed for one set of quadrupoles. The excitation ratio between the two neighboring sets of quadrupoles determines the exact position of the round lens field. If the quadrupole coils are all identical, equal currents should be applied to the coils of each quadrupole.

Figure 20:
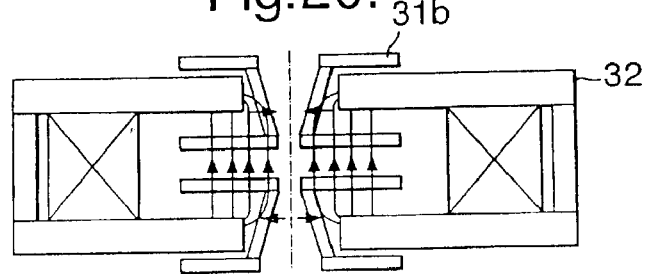
FIG. 20 is a side view of a slider lens according to a second variant of the fourth embodiment.

In a second variant of the fourth embodiment, the quadrupole coils 31b are made in more complicated forms than simple windings in order to satisfy Equation 11. This is shown in FIG. 20.

Ferrites can be placed in the magnetic slit in such a fashion that the magnetic field of the slit coils 32 is relatively undisturbed, while the magnetic field of the quadrupole coils 31b is shaped to satisfy Equation 11.

The lens iron of the magnetic slit can also be shaped in more complicated forms to yield a magnetic quadrupole field which satisfies Equation 11. This will change the magnetic field strength locally such that the focal length can be adapted locally as a function of the longitudinal position in the slit.

The width of the magnetic slit can be varied in order to enable varying focal length for different round lens field positions without changing the current of the coil of the magnetic slit. Aberrations due to asymmetry of the slit around one round lens field can be compensated with higher order electron-optical elements such as, for example, sextupoles, which are formed by applying the correct currents to the wires of the quadrupole coil rows, see below.

The lens iron can be segmented, and additional coils could be used to yield a magnetic field which satisfies Equation 11.

The coils can be placed in four rows at the entrance, and four rows at the exit of the magnetic slit, with the coils of the outer rows significantly thinner than the inner row coils. The thin coils can be used to add small correction fields to the quadrupole to correct, for example, material tolerances and misalignment.

Figure 21:
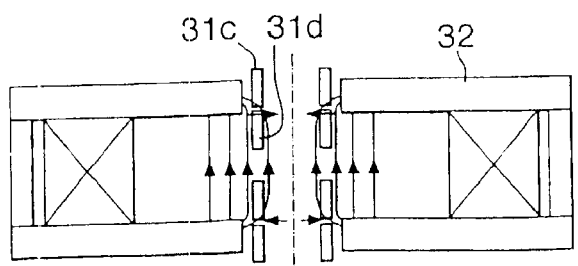
FIG. 21 is a side view of a slider lens according to a third variant of the fourth embodiment.
Figure 22:
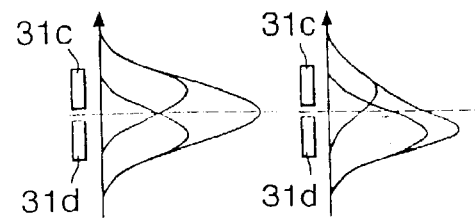
FIG. 22 is a diagram showing how the vertical position of the quadrupole can be varied in the third variant of the fourth embodiment.

In a third variant of the fourth embodiment, the quadrupole coils are segmented in the z direction in two or more smaller coils 31c, 31d, in order to be able to shift the quadrupole field along the z-axis by varying the ratio of the currents in both coils. This could be used for correction when, for example, the effective principal plane of the slider lens has different z-positions for the x and y directions. This is shown in FIGS. 21 and 22, the latter illustrating how the quadrupole field is shifted in the z direction.

The field of the quadrupole coils induced by the horizontal currents in the y direction can be shielded from the beam by the use of additional slits made of lens iron or ferrite, which are placed above and beneath the magnetic slit of the slider lens, so called field clamps.

Field clamps can also be used to limit the extent of the magnetic field of the slider lens in the positive and negative z direction, outside the construction.

The field clamps can be 'shared' with the slider deflectors which are placed above or beneath the slider lens.

More then one round lens field can be generated at the same time at different positions in the magnetic slit, thus enabling multibeam applications.

To minimize placement errors in case the slider lens is used for multibeam applications, two extra lens fields should be generated in such a fashion that all lens fields which are actually used to focus a beam are positioned in between two, equidistant, lens fields. This follows from symmetry considerations.

In a fourth variant of the fourth embodiment only selectable coils 34, oriented as in the first variant, in two rows, one either side of a slit, are provided. These can then be used to create various other forms of sliding electron-optical elements, as shown in FIGS. 23 to 34.

Figure 23:
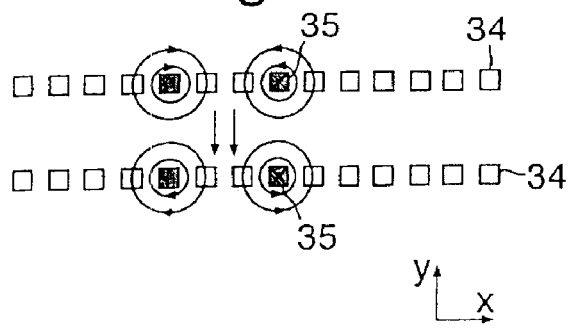
FIGS. 23 and 24 are top plan and cross-sectional views of a fourth variant of the fourth embodiment with coils energized to form a slider deflector.
Figure 24:
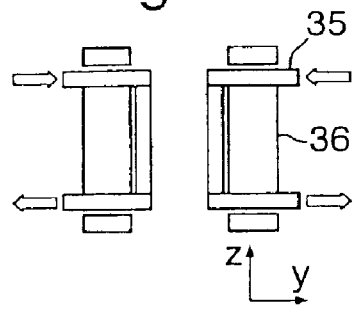

In FIGS. 23 to 26, two rows of coils 34 are used to form a slider deflector. The direction of these rows is parallel to the x-axis. The coils 34 are oriented perpendicular to the direction of the rows, parallel to the z-axis. To obtain deflection in the x direction, a magnetic field in the y direction is needed. This field is obtained by exciting four coils 35, two on each row, in such a way that two opposing coils in different rows have identical currents, while coils of the same row have equal but opposite currents, as shown in FIGS. 23 and 24.

Figure 25:
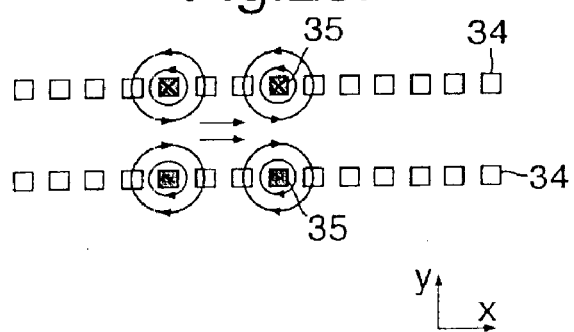
FIGS. 25 and 26 are views similar to FIGS. 23 and 24 but with coils energized to form a perpendicular slider deflector.
Figure 26:
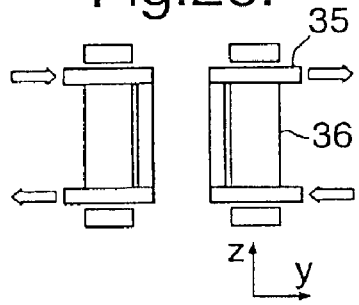

For deflection in the y direction, a magnetic field in the x direction is needed. This can be obtained in the same device, but now equal currents of the same direction are applied to coils on the same row, with two equal but opposite currents applied to the two coils on the other row which are facing the first two coils, as shown in FIGS. 25 and 26.

The deflection fields can be superimposed to obtain deflection in both x and y directions at the same time. This can be done by adding the currents needed for the two deflection directions and applying the resulting currents to the same four coils, or by 'nesting' the deflectors, i.e. by applying currents to eight coils at the same time with symmetry in the currents around the y, z plane through the middle of the deflection field.

Each type of deflection field, (i.e. x, y or x&y deflection field) can be displaced along the x-axis by applying currents to other coils in the row. Furthermore, it can be positioned at any arbitrary point along the x-axis by applying currents to two sets of neighboring deflectors in such a way that the total current remains the same as for one set of deflectors. The excitation ratio between the two neighboring sets determines the exact position of the deflection field.

There are two basic principles to make a quadrupole using again two rows of coils 34, with the direction of these rows alongside the x-axis and the coils oriented perpendicular to the direction of the rows. These principles are illustrated in FIGS. 27 to 30.

Figure 27:
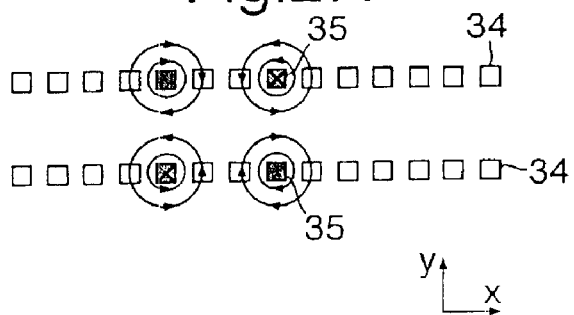
FIGS. 27 to 32 are views similar to FIGS. 23 and 24 but with coils energized to form quadrupoles at various angles.
Figure 28:
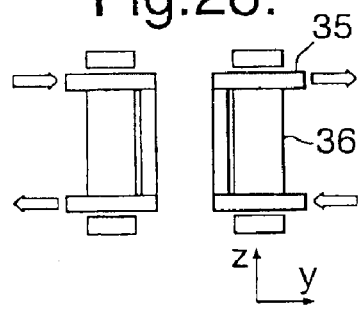

Equal currents are applied to four coils 35, two on each row, in such a fashion that on each row there are opposite currents, facing opposite currents also on the coils on the other row. This configuration gives, depending on the sign of the currents, either a positive focal length in the x direction and a negative focal length in the y direction, or a negative focal length in the x direction and a positive focal length in the y direction. This arrangement is shown in FIGS. 27 and 28.

Figure 29:
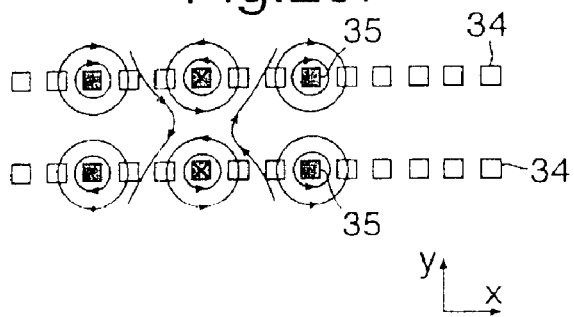
Figure 30:
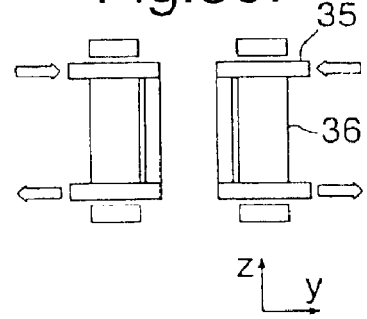

Currents are applied to six coils, three on each row, with the x, z plane as a plane of symmetry for both currents and coils. The currents on the outer four coils are of opposite sign from the two center coils. The currents on the outer four coils are equal, and the currents of the center coils are equal too but not necessarily the same as the outer coil currents. This configuration gives, depending on the sign of the currents, a quadrupole field which is rotated with 45° with respect to the previous quadrupole configuration. This arrangement is shown in FIGS. 29 and 30.

Both types of quadrupoles can be positioned at any point along the x-axis by applying currents to neighboring coils in such a fashion that those coils also form a quadrupole field. The displacement of the quadrupole field is determined by the ratio of the coil excitations of the neighboring quadrupoles.

Figure 31:
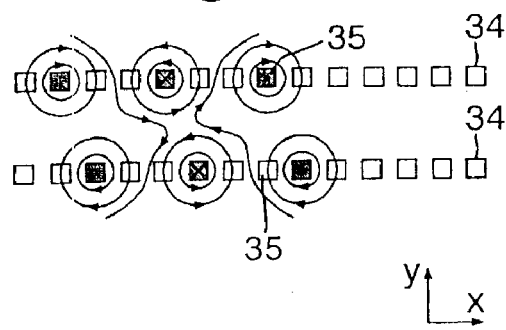
Figure 32:
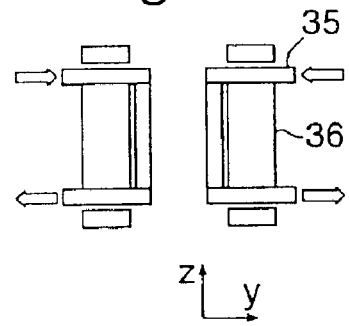

The fields of the two types of slider quadrupoles described above can be combined to yield a total quadrupole field which is rotated with arbitrary angle. The combined quadrupole can be positioned at any point along the x-axis by applying the necessary currents to neighboring coils 35, as shown in FIGS. 31 and 32. The displacement of the quadrupole field is determined by the ratio of the coil excitations of the neighboring combined quadrupoles. This rotated quadrupole can be used as a stigmator.

Figure 33:
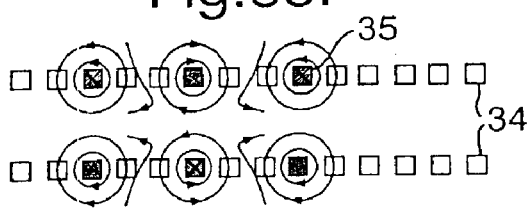
FIGS. 33 and 34 are views similar to FIGS. 27 and 24 but with coils energized to form a sextupole.
Figure 34:
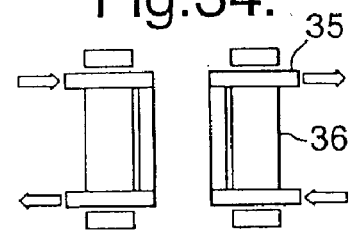

Again, two rows of coils 34 can be used to form a slider sextupole, as shown in FIGS. 33 and 34. The direction of these rows is alongside the x-axis. The coils are oriented perpendicular to the direction of the rows. A sextupole field is induced when currents are applied to six coils 35, three on each row, with the excited coils 35 placed symmetrically around the x, z plane. The direction of the current in the coils is opposite for both opposite and neighboring coils, the currents of the four outer coils are all equal, and the currents of the two center coils are equal.

In all the variants of the fourth embodiment, the selectable coils can be wound around a lens iron or ferrite core 36 to enhance the field strength. Plates of lens iron or ferrite can be used as field clamps above and below the slider deflector to shield the horizontal currents from the electron beam and to limit the extent of the magnetic field along the optical axis. The coils can also consist of single turns or bent wires. The coils can be made in more complicated forms than simple windings to maximize the performance and minimize the aberrations. The coils can be segmented in the z direction in two or more smaller coils, to be able to shift the pivot point of the deflector by varying the ratio of the currents in both coils.

Embodiment 5

Figure 35:
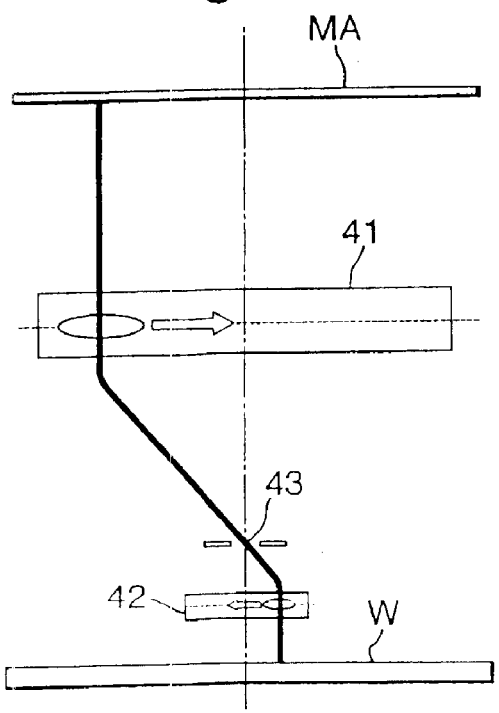
FIG. 35 is a diagram of the projection system in a lithographic apparatus according to a fifth embodiment of the invention.

In a fifth embodiment of the invention two sliding lenses 41, 42 are combined in a doublet either side of a cross-over 43, as shown in FIG. 35. The movement of the effective generated lenses is shown by arrows. The fifth embodiment of the invention is otherwise the same as the embodiments described above.

Figure 37:
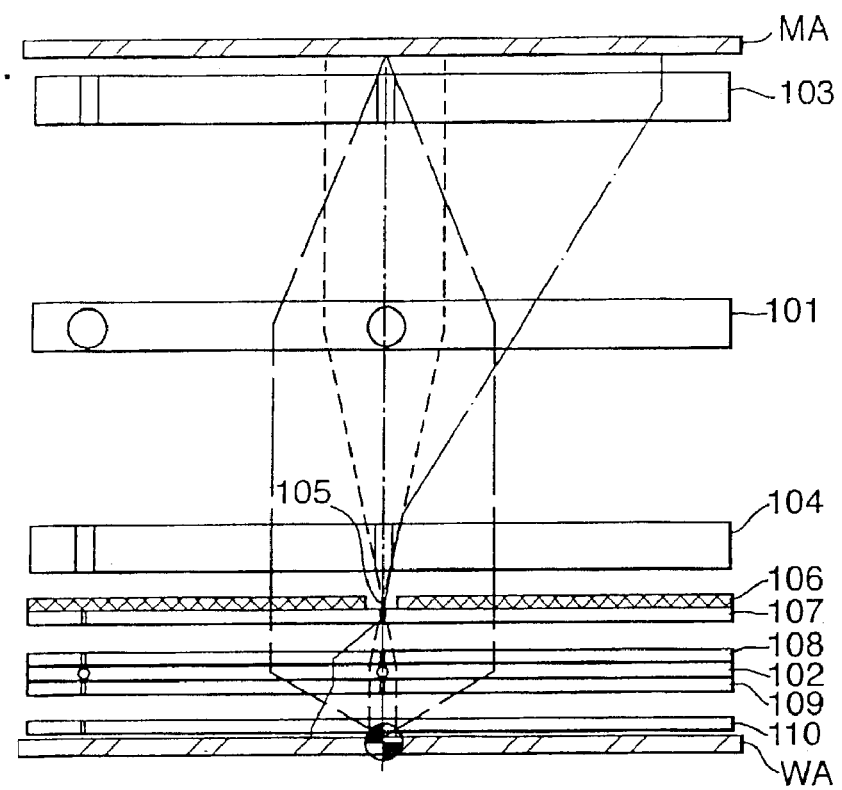
FIG. 37 is a diagram of the projection system in a lithographic apparatus according to a first variant of the fifth embodiment.

A first variant of the projection system of the fifth embodiment is shown in FIG. 37. This comprises, in order from mask MA to substrate W:

a slider X-deflector 103;

a slider lens 101;

a slider X-deflector 104;

an aperture 106;

a slider X-deflector 107;

a slider X-deflector 108;

a slider lens 102;

a slider X-deflector 109; and a slider X-deflector 110.

The projection system is a doublet with demagnification of 4 to minimize the influence of distortion and aberrations. Therefore it is point symmetric in the cross-over.

doublet also requires that the optical pathlength from reticle to lens principal plane is identical to the optical pathlength from lens principal plane and cross-over. This condition is fulfilled by placing the deflectors at equal distances above and below the principal plane of the lens.

The deflection angles are significant. This results in the deflection astigmatism. By combining a deflector with a quadrupole compensation is possible.

This arrangement uses the minimum number of elements to fulfil the doublet condition, but the position of the deflectors is coupled since the position determines the symmetry in object and image focal length of the slider lens.

Figure 38:
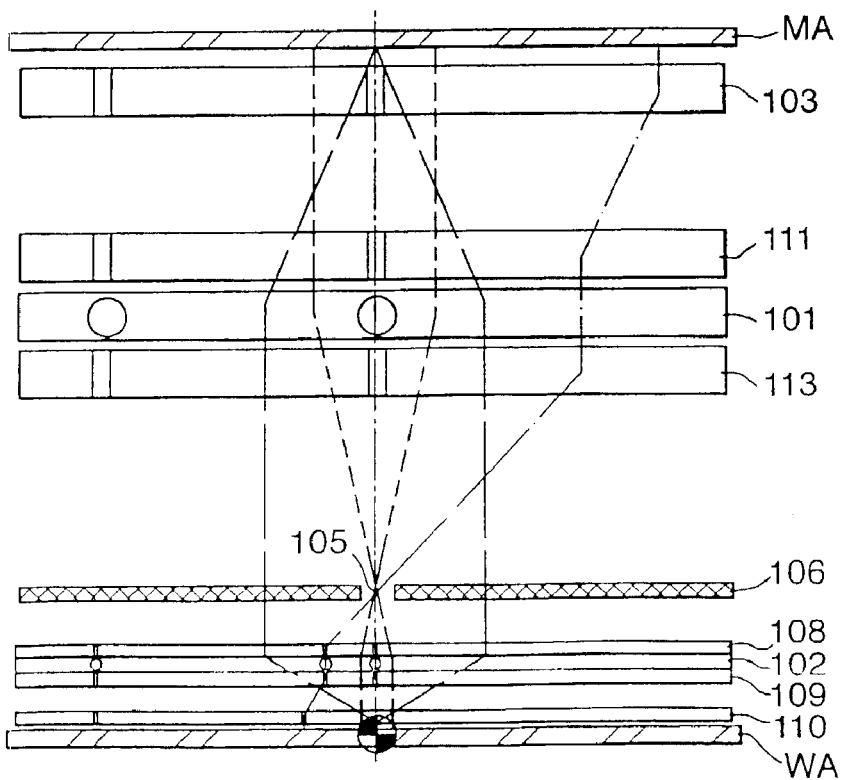
FIG. 38 is a diagram of the projection system in a lithographic apparatus according to a second variant of the fifth embodiment.

FIG. 38 shows a second variant of the projection system of the fifth embodiment. This comprises, in order from mask MA to substrate W:

a slider X-deflector 113;

an aperture 106;

a slider X-deflector 108;

a slider lens 102;

a slider X-deflector 109; and a slider X-deflector 110.

Again, the projection system is a doublet with demagnification of 4 to minimize the influence of distortion and aberrations and is point symmetric in the cross-over.

A doublet also requires that the optical pathlength from reticle to lens principal plane is identical to the optical pathlength from lens principal plane and cross-over. This condition can be fulfilled by a certain ratio in the deflection above the lens and below the lens.

The beam passes straight through the slider lens. This will result in less aberration than in the case of the first variant of the sixth embodiment.

Figure 39:
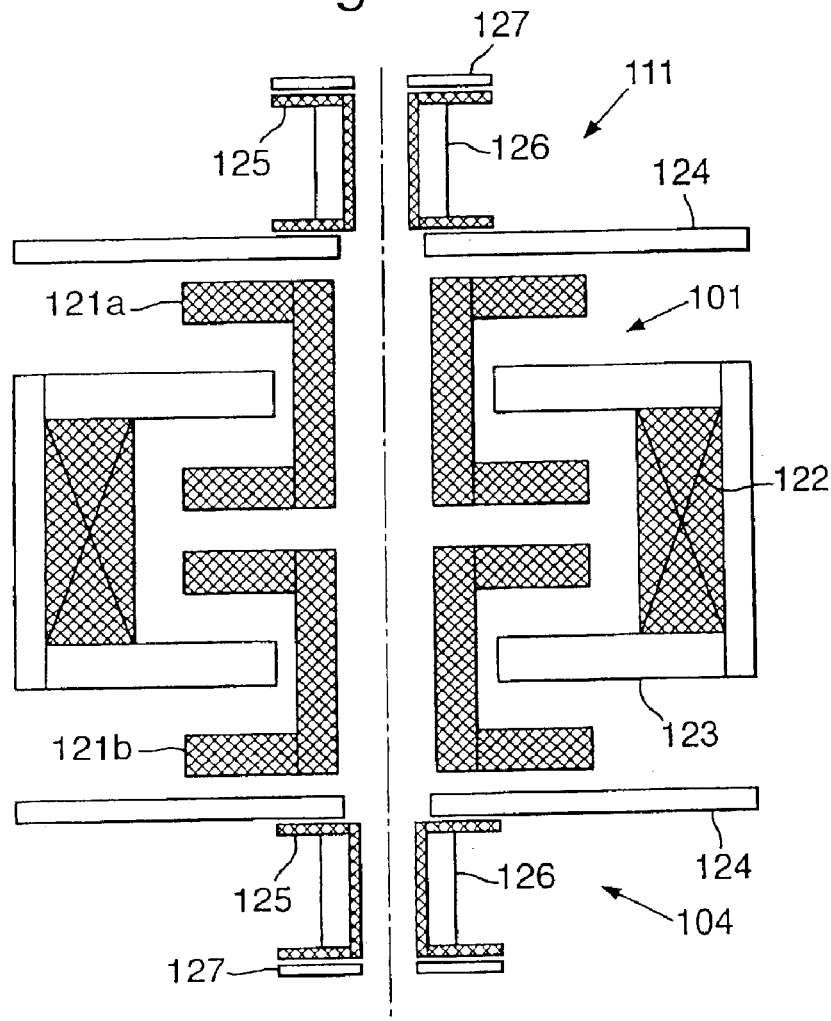
FIGS. 39 and 40 are cross-sectional views of the first and second slider lens-deflector groups in the second variant of the fifth embodiment.
Figure 40:
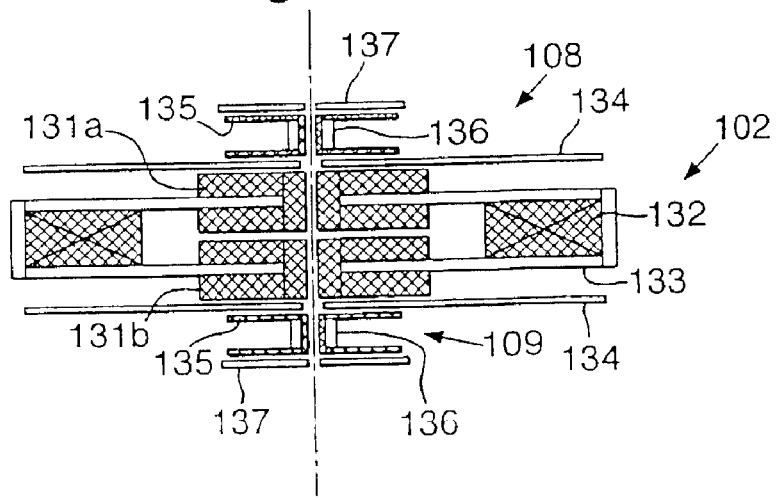

Additional deflectors are positioned directly above and below the slider lens. It is favorable to start the deflection field only after the beam has left the lens field since this field rotates the beam. Therefore the lens should be small and field clamps have to limit the field along the z-axis. This is shown in FIGS. 39 and 40 which respectively show the deflector-lens-deflector groups 111, 102, 104 and 108, 102, 109. In these Figures the selectable coils of the slider lenses are referenced 121a, 121b and 131a, 131b with the slit coils referenced 122, 132. The slider deflectors are formed by selectable coils 125, 135 wound on cores 126, 136. Field clamps are referenced 124, 127, 134, 137.

The deflection angles are significant. This results in deflection astigmatism. By combining a deflector with a quadrupole compensation is possible.

In this variant, the beam passes through the slider lens parallel to the system axis. This will result in minimal aberration blur, however, reflection angles are larger and therefore also deflection aberrations. This is because there is no deflection in lens area.

Figure 41:
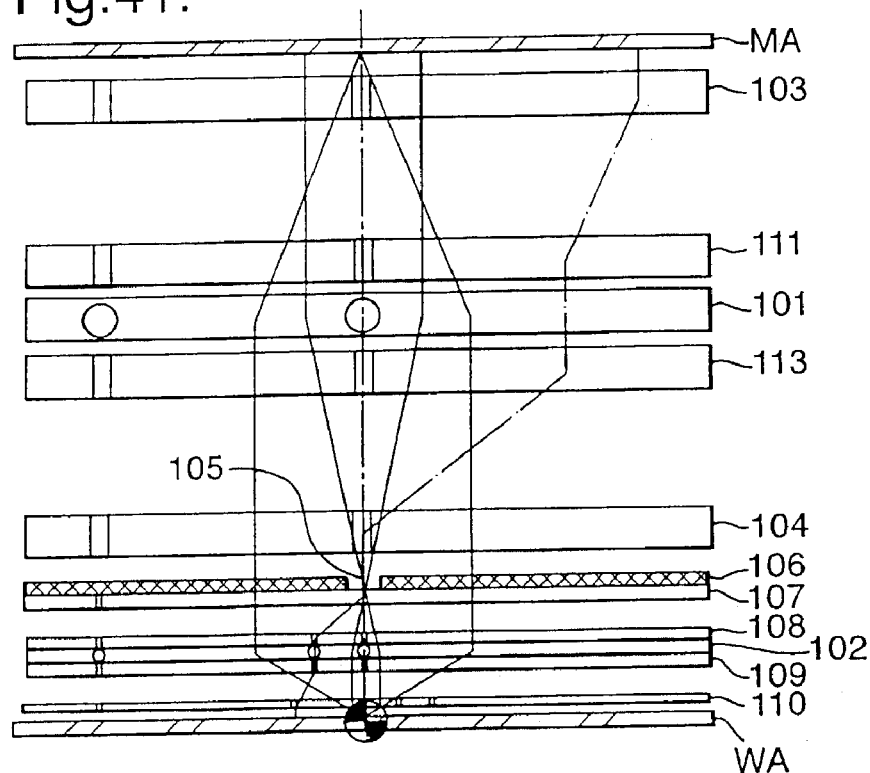
FIGS. 41 to 44 are diagrams of projection systems in lithographic apparatus according to third to seventh variants of the fifth embodiment.

A third variant of the projection system of the fifth embodiment is shown in FIG. 41. In order from the mask MA to the substrate W, this comprises:

a slider X-deflector 103;

a slider X-deflector 111;

a slider lens 101;

a slider X-deflector 113;

a slider X-deflector 104;

an aperture 106;

a slider X-deflector 112;

a slider X-deflector 108;

a slider lens 102;

a slider X-deflector 109; and a slider X-deflector 110.

As before, the projection system is a doublet with demagnification of 4 to minimize the influence of distortion and aberrations and is point symmetric in the cross-over.

A doublet also requires that the optical pathlength from reticle to lens principal plane is identical to the optical pathlength from lens principal plane and cross-over. This condition is fulfilled by placing the deflectors at equal distances above and below the principal plane of the lens.

The beam passes straight through the slider lens. This will result in less aberration than in the case of the first variant.

Compared to the first variant, additional deflectors 111, 113 are positioned directly above and below the slider lens. It is favorable to start the deflection field only after the beam has left the lens field since this field rotates the beam. Therefore the lens should be small and field clamps have to limit the field along the z-axis, similar to those shown in FIGS. 39 and 40.

The deflection angles are significant. This results in deflection astigmatism. By combining a deflector with a quadrupole compensation is possible. In this variant there is symmetry in position and excitation of the deflectors above and below the slider lenses 101, 102. This is also the case for the quadrupole lens field.

In this variant, the beam passes through the slider lens parallel to the system axis. This will result in mini aberration blur. Also, the doublet condition is fulfilled in case of astigmatism deflectors by adding quadrupole fields. However, deflection angles are larger and therefore also deflection aberrations. This is because there is no deflection in the lens area and around the cross-over.

Figure 42:
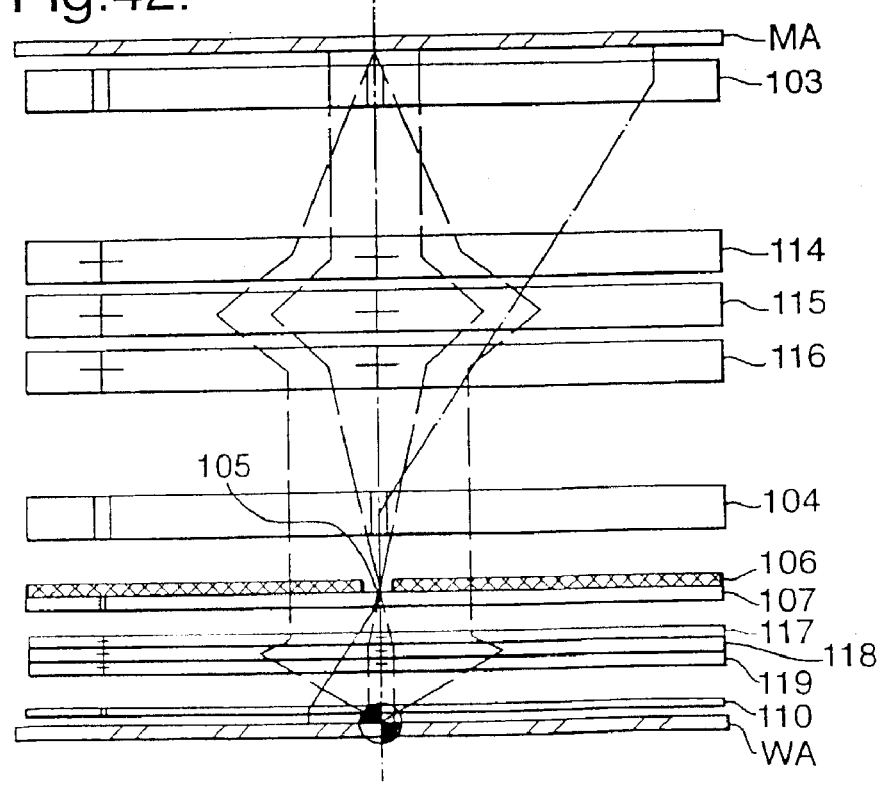

FIG. 42 shows a fourth variant of the projection system of the fifth embodiment. In order from the mask MA to the substrate W, this comprises:

a slider X-deflector 103;

three slider quadrupoles 114, 115, 116;

a slider X-deflector 104;

an aperture 106;

a slider X-deflector 107;

three slider quadrupoles 117, 118, 119; and a slider X-deflector 110.

As before, the projection system is a doublet with demagnification of 4 to minimize the influence of distortion and aberrations and is point symmetric in the cross-over.

In this variant, combinations of several quadrupoles 114–116 and 117–119 act as round lenses. The benefit is that the beam does not rotate in such a lens. The deflectors can therefore be combined with the deflection field resulting in smaller deflection angles. This will minimize the deflection aberrations.

To fulfill the conditions of a doublet, the following system requirements are satisfied with a symmetric round lens:

A ray leaving perpendicular to the reticle plane has to cross the optical axis at the cross-over plane. This has to be fulfilled in x and y directions.

A ray leaving from a point on the optical axis at the reticle plane with a certain angle to the optical axis has to pass through the cross-over plane parallel to the optical axis. This has to be fulfilled in x and y directions.

The deflection angles are significant. This results in deflection astigmatism. By combining a deflector with a quadrupole compensation is possible. In this variant there is symmetry in place and excitation of the deflectors above and below the slider lens. This is also the case for the quadrupole lens field.

In this variant, the focal length can be adjusted per beamlet in a multibeam apparatus since there is no general field as is the case with the slit field in a slider lens. There is no beam rotation so deflectors can be combined with quadrupoles. The doublet condition is fulfilled also in case of astigmatism corrected deflectors by adding quadrupole fields.

Figure 43:
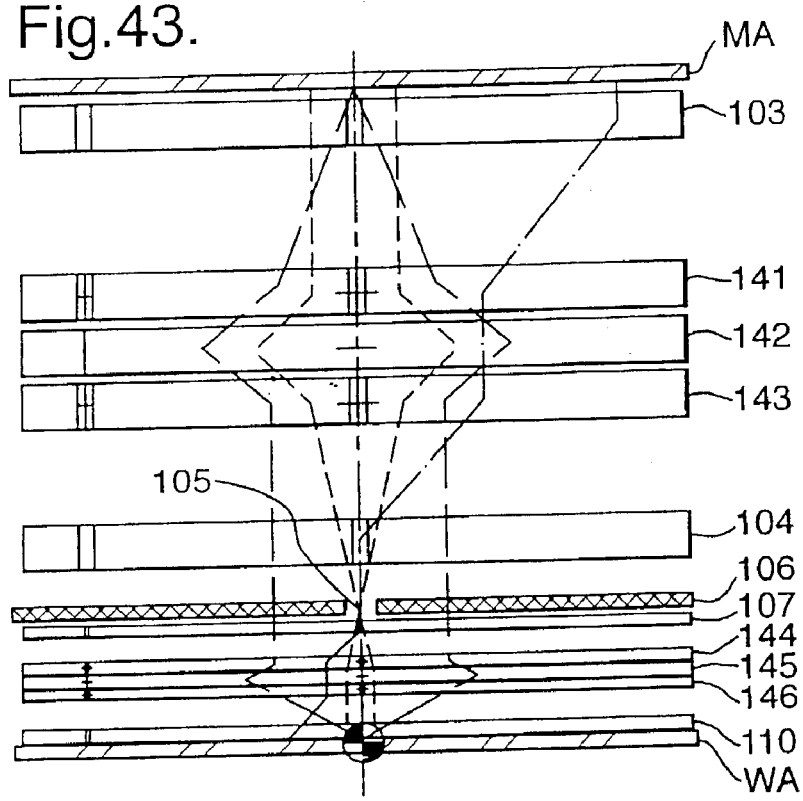

FIG. 43 shows a fifth variant of the projection system of the fifth embodiment which comprises, in order from the mask MA to the substrate W:

a slider X-deflector 103;

a hybrid slider deflector-quadrupole 141;

a slider quadrupole 142;

a hybrid slider deflector-quadrupole 142;

a slider X-deflector 113;

an aperture 106;

a slider X-deflector 107;

a hybrid slider deflector-quadrupole 144;

a slider quadrupole 145;

a hybrid slider deflector-quadrupole 145; and a slider X-deflector 110.

As before, the projection system is a doublet with demagnification of 4 to minimize the influence of distortion and aberrations and also is point symmetric in the cross-over.

A combination of several quadrupoles will act as a round lens. The benefit is that the beam does not rotate in this lens. The deflectors can therefore be combined with the quadrupole field resulting in smaller deflection angles. This will minimize the deflection aberrations.

To fulfil the conditions of a doublet, the following system requirements are satisfied with a symmetric triplet acting as round lens:

A ray leaving perpendicular to the reticle plane has to cross the optical axis at the cross-over plane. This has to be fulfilled in x and y directions.

A ray leaving from a point on the optical axis at the reticle plane with a certain angle to the optical axis has to pass through the cross-over plane parallel to the optical axis. This has to be fulfilled in x and y directions.

The beam passes straight through the central lens. Probably this will result in less aberration than in the case of the fourth variant. However deflection angles are larger because deflection is not possible in the area between the quadrupoles.

The deflection angles are significant. This results in deflection astigmatism. By combining a deflector with a quadrupole compensation is possible. In this variant there is symmetry in position and excitation of the deflectors above and below the slider lens. This is also the case for the quadrupole lens field.

In this variant, the focal length can be adjusted per beamlet in a multibeam apparatus since there is no general field as is the case with the slit field in a slider lens. There is no beam rotation so deflectors can be combined with quadrupoles. The beam passes through central quadrupole parallel to the optical axis. The doublet condition is fulfilled also in case of astigmatism corrected deflectors by adding quadrupole fields. However, the deflection angles are larger than in the fourth variant because there is no deflection in between quadrupoles.

Figure 44:
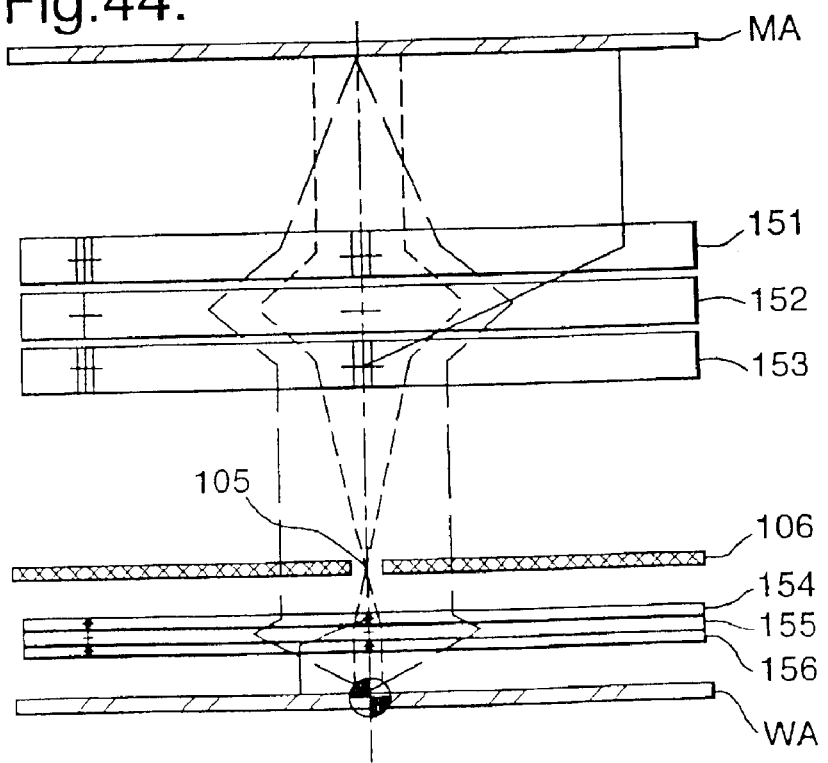

A sixth variant, shown in FIG. 44, is similar to the fifth variant but omits the slider deflectors thus comprising only hybrid slider deflector-quadrupoles 151, 153, 154, 156 and slider quadrupoles 152, 155. This variant has a minimum of components and, if the quadrupoles can be placed at large distances from each other, the deflector angles will be similar to those of the fifth variant.

Embodiment 6

Figure 36:
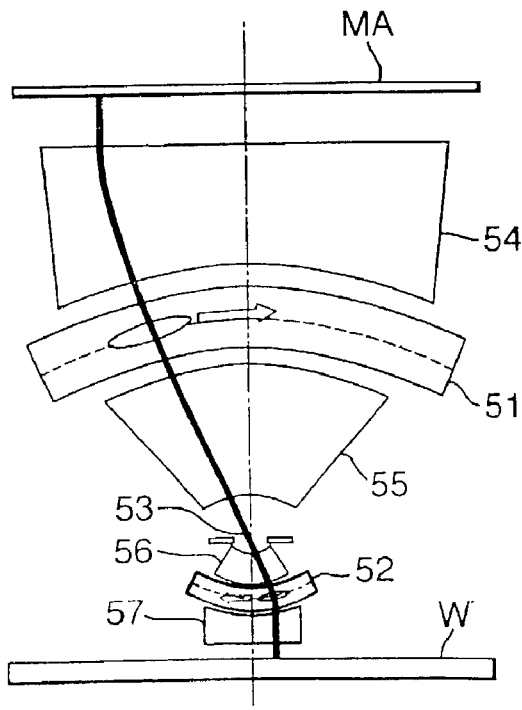
FIG. 36 is a diagram of the projection system in a lithographic apparatus according to a sixth embodiment of the invention.

The sixth embodiment of the invention is a variation of the fifth embodiment. As shown in FIG. 36, the sliding lenses 51, 52, again positioned either side of cross-over 53, are curved so that the generated spherical lens follows an arcuate path, as shown by arrows. Additional magnetic fields to bend the projection beam are generated in the regions 54, 55, 56 and 57. The overall effect is to reduce the sharpness of the bends in the projection beam which reduces aberration.

Embodiment 7

A seventh embodiment of the invention, which may be the same as the embodiments described above, decreases the influence of Coulomb interaction in a system with small convergence angle. A small convergence angle allows a large exposure field and decreases the axial chromatic aberration.

According to the sixth embodiment, a magnetic field at the electron source is provided to prohibit off-axis electrons to ever cross the axis: they will spiral around this axis. Thus, the cross-over, which in this embodiment takes the form of a "whirlpool" can be large while the convergence angle at the wafer is small. The landing angle is not perpendicular, but still within the acceptable range of illumination angles. Field curvature blurs are now transformed to field curvature distortions. These can be corrected by pre-distortion of the mask.

More specifically, a magnetic field $B_s$ at the electron source will give the electrons a velocity component in the $\phi$-direction. The velocity perpendicular to the motion of the electrons is proportional to the distance $r_c$ from the axis. This velocity $V_{\perp s}$), the transverse velocity at the wafer ($V_{\perp w}$) and the z-velocity at the wafer ($V_{za}$) are given by.

$$V_{\perp s} = \frac{e}{2m} B_s r_c. \quad (11)$$

$$V_{\perp w} = \frac{eB_s}{\sqrt{2\,m}} \frac{r_c^2}{F}. \quad (12)$$

$$V_{zw} = \sqrt{\frac{2eU}{m}} \quad (13)$$

For a tilt angle ($V_{\perp w}/V_{za}$) of 10 mrad at the wafer a magnetic field of 1 T is necessary if the exposure field F is 0.25×0.25 mm². It is 0.25 T if the exposure field is 1×1 mm².

This requires the following source characteristics: 80 µA from a square of 85×85 µm² [340×340 µm²] implies a current density J=1.11 10⁴ A/m² [4 10³ A/m²]. This corresponds to a reduced brightness $B_r$=J/kT=6.5 10⁴ A/m².sr.eV [4 10³ A/m².sr.eV] at 2000 K, which is the typical brightness of a LaB₆ or oxide cathode. The listed values are for an exposure field of 0.25×0.25 mm²; those within brackets are valid for an exposure field of 1×1 mm² at the wafer.

The gain in allowable beam current is compared between two cases:

1. conventional system with increased exposure field size (1×1 mm²) and reduced convergence angle (0.3 mrad)

2. system with increased exposure field size (1×1 mm²) and whirlpool cross-over. The maximum tilt angle is 10 mrad and the convergence angle is 0.3 mrad. The aperture is now square. At the corners, the beam is 10 mrad times 40 mm focal length, so it is a square of 560×560 µm². The dominant interactions will be in the cross-over again, because at the wafer the beam is 1000×1000 µm².

The assumption is made that Jansen's scaling laws for stochastic Coulomb interaction are valid. Accordingly:

$$d_{Cl} \propto \frac{I^{\frac{2}{3}}}{F.r_c^{\frac{1}{3}}} \quad (15)$$

where rc=radius of the cross-over, case 1=12 µm, case 2=396 µm

It can be calculated that the whirlpool cross-over gives a current increase of a factor 5.7. Due to uncertainty in this calculation, the improvement is assumed conservatively: it will be at least a factor 2. Tis gives a current of about 60 µA in an exposure field of 1×1 mm² at the wafer.

Certain modifications to the remainder of the apparatus are desirable in this embodiment:

The landing is not perpendicular. Although the angle is within the cone that is used for illumination, it does mean that a height error of the wafer causes a displacement of the pattern instead of a blur, and the requirements on placement are more stringent than those on blur.

The mask must be predistorted. The distortions caused by the tilted illumination are going to be about 16 times those of the conventional system because of the increased exposure field size. Therefore they are in the order of 300–800 nm at the wafer, so the mask pattern must be distorted by about 1.5–3.5 µm at the corners.

Stepping instead of scanning. The predistorted mask also necessitates a different writing strategy: the illumination cannot be continuously scanned over a stripe any more, because then each point in the field is first illuminated with a positive tilt angle and then, at the other end of the illumination, with a negative tilt angle. Instead therefore, well-defined square subfields, which are illuminated by a square illumination field, are provided. Each subfield has a predistortion, which might depend on how far off-axis it is when illuminated. At 40 wafers per hour, the illumination time of a 1×1 mm² subfield is in the order of 1~2 msec. Between subfields, the deflectors and correctors must be reset and settled. Seam blending can be done by an illumination scan of say 10 µm in both directions during the exposure. An alternative is variable shaped illumination.

Figure 45:
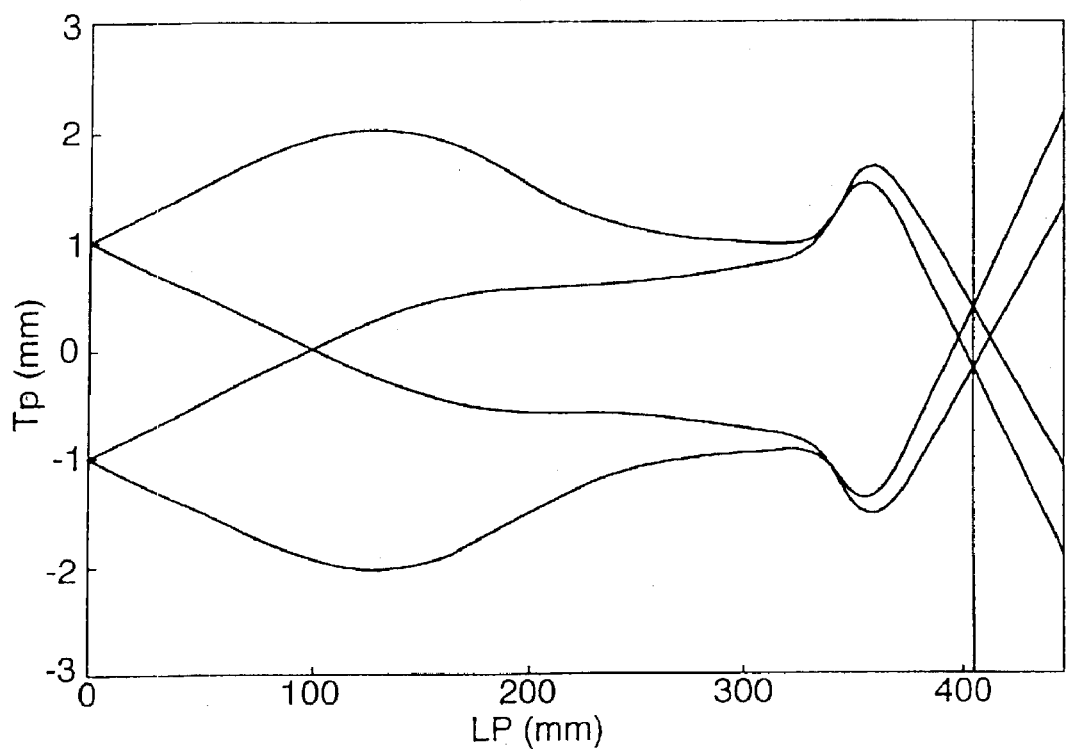
FIG. 45 is a diagram of particle trajectories in the projection system of a known e-beam lithographic apparatus.
Figure 46:
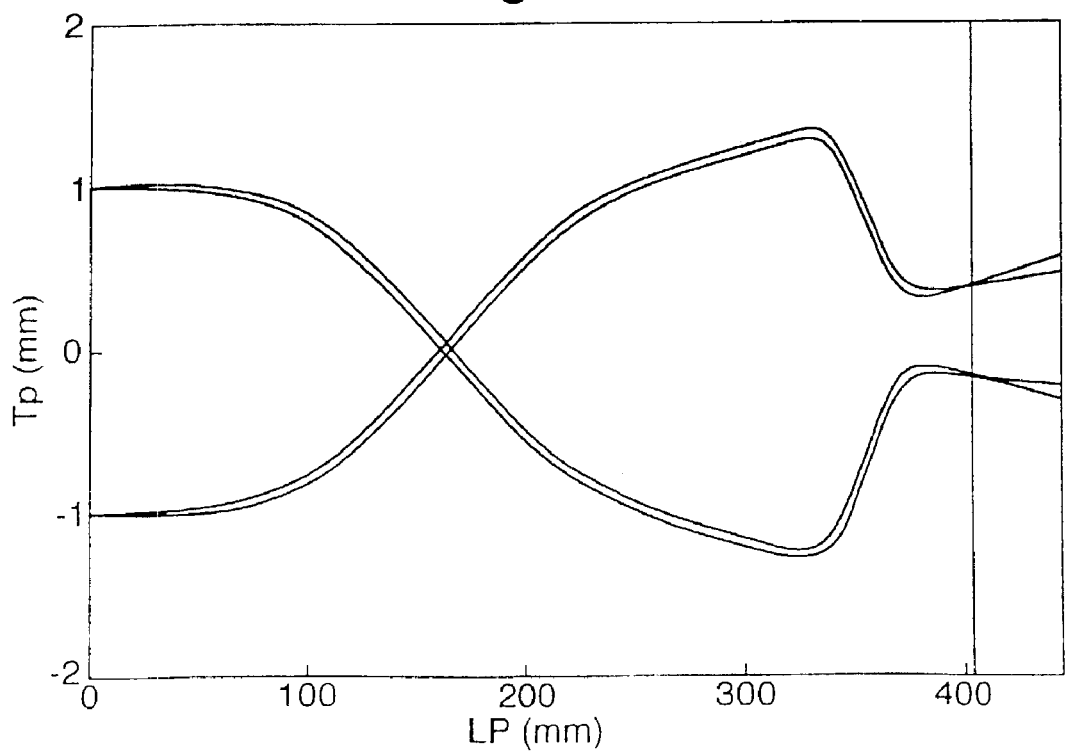
FIG. 46 is a diagram of particle trajectories in the projection system of a lithographic projection apparatus according to a seventh embodiment of the invention.

FIGS. 45 and 46 show transverse position, Tp, versus longitudinal position, Lp, for four calculated electron trajectories. The electrons were launched with angles of 10 mrad (conventional system, shown in FIG. 45) and 0.3 mrad (Sixth embodiment, with whirlpool cross-over). The result shows that the image is focused at 405 mm from the wafer and that the demagnification of a factor 4 is reached.

In a calculation the magnetic field near the source is simulated. The particles get an additional direction in the φ-direction. The particles at the edge and at the corner get 7.96 mrad and 11.3 mrad, respectively. The half opening angle is reduced from 10 mrad to 0.3 mrad simultaneously. This calculation predicts the following spot sizes:

TABLE 4

| Spot position | Spot size [nm] |
|---|---|
| Original: corner | 25 |
| Whirlpool: center | 0.663 |
| Whirlpool: edge | 0.810 |
| Whirlpool: corner | 2.055 |

The reduction of spot size is about a factor 10 at the corners. The field curvature found from both calculations is reduced by a factor 5 (fit coefficients: −0.786 for 10 mrad and −0.0348 for 0.3 mrad).

When the electrons pass through the mask they lose energy. Experimental measurements show that the loss is about 22 eV. The calculations above were repeated for electrons with energies of 99.978 keV. The influence on the spot size was minimal (changes of 0.02 nm). Thus is due to the small convergence angle that reduces the axial chromatic blur by a factor of 20 compared to a conventional design. The focal point shifted by about −10 µm for the slower electrons.

Figure 47:
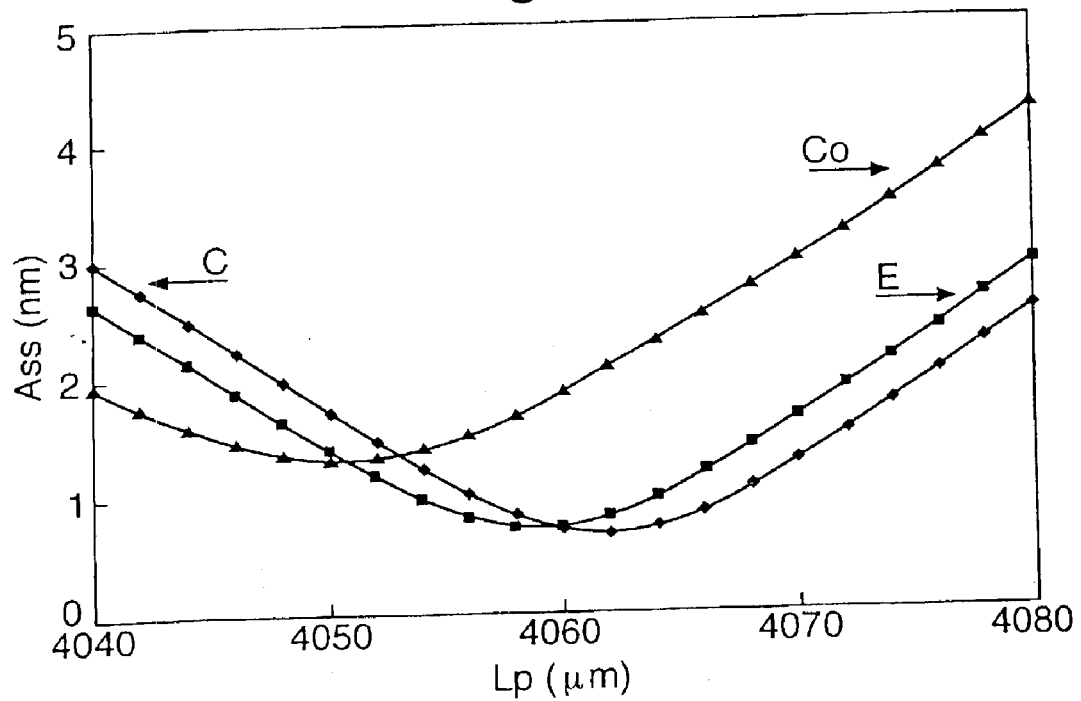
FIG. 47 is a graph of blur size as a function of longitudinal position, of the substrate in the lithographic projection apparatus of the seventh embodiment of the invention.

The angles at which the electrons reach the wafer are ±40 mrad for the normal case when electrons are launched with an angle of 10 mrad. When the magnetic field is turned on, the opening angle goes down, but the electrons have an angle when they reach the mask. The spot size was calculated for several longitudinal positions. FIG. 47 shows the result of a calculation in which a 4.0 mm square sub-field size at the mask was taken. The energy of the electrons was 100 keV. The three curves are the standard deviations of the spot size for longitudinal positions, Lp, between 404 and 408 mm. The wafer could be positioned at about 405 mm from the mask This would give blur sizes that would be approximately the same in the center and at the edges. Arrows C, Co and E respectively indicate the direction of the centre, corner and edge of the substrate.

Figure 48:
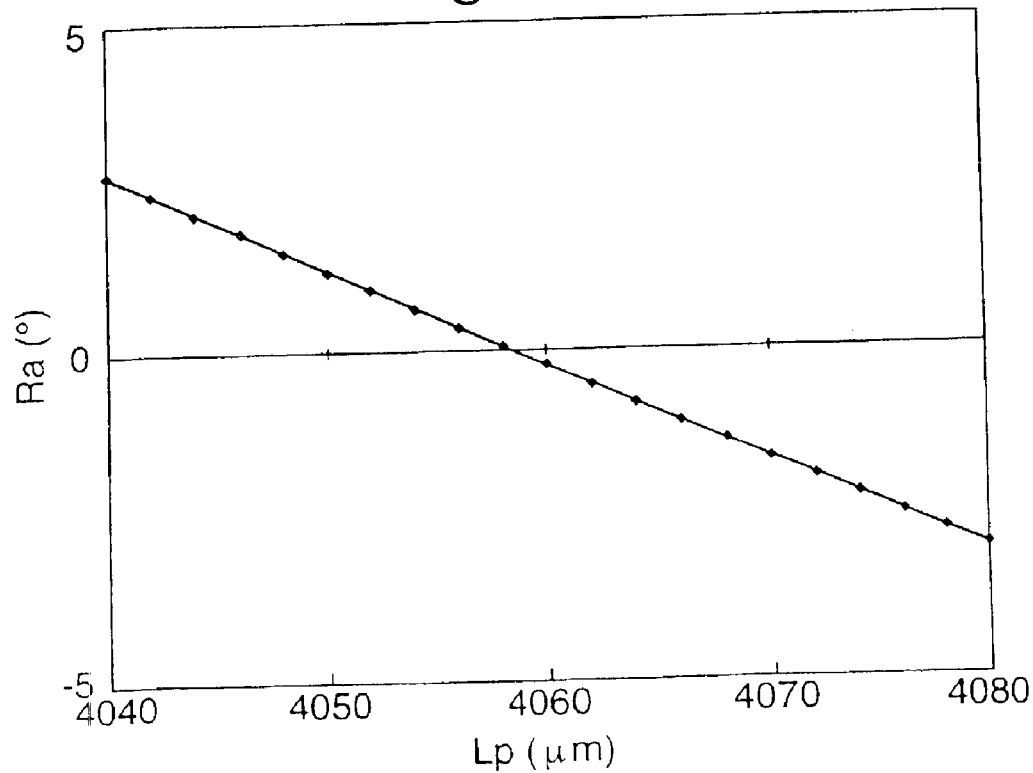
FIG. 48 is a graph of image rotation as a function of longitudinal position of the substrate in the lithographic projection apparatus of the seventh embodiment of the invention.

Because of the motion in φ-direction at the mask, the electrons have an additional angle when they arrive at the wafer. FIG. 48 shows the rotation, Rc, of the corner with respect to the unperturbed case for different values of longitudinal position, Lp. The electrons were launched from a grid of 4×4 mm². This means that the distortion of the mask could be considerable, depending on the distance between the wafer and the mask.

The above calculations basically prove two things:

With the whirlpool cross-over good imaging quality can be realized.

Reoptimization of the system parameters (larger exposure field, smaller convergence angle) is advantageous to decrease the influence of aberrations. This improves the extensibility.

It should be noted that the concept of a whirlpool cross-over of the seventh embodiment can be combined to especial advantage with a slider lens according to the fourth fifth and sixth embodiments to improve the effective field to a full die.

Embodiment 8

The eighth embodiment of the invention, which maybe the same as embodiments described above save as described below, also decreases the influence of Coulomb interaction in a system with a small convergence angle.

Figure 49:
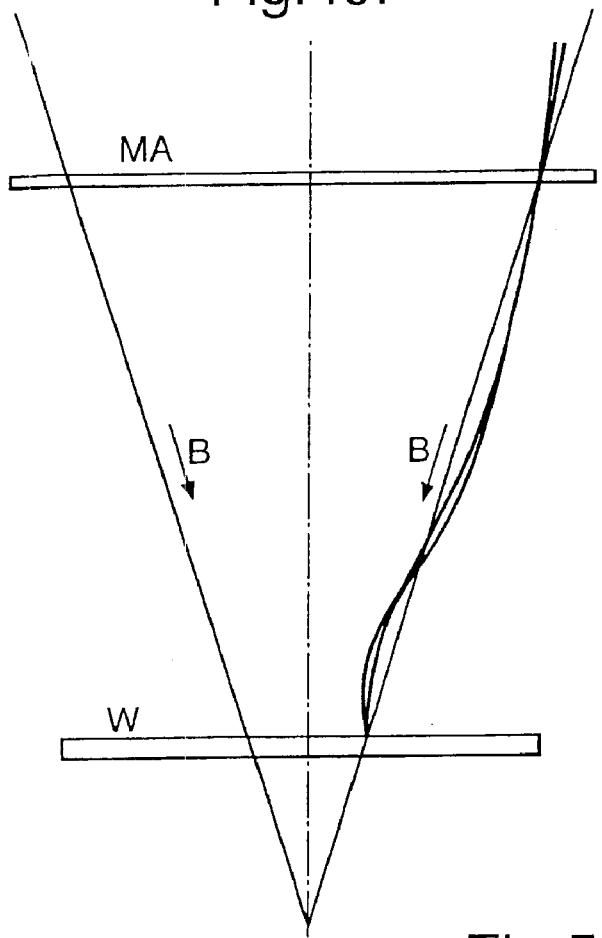
FIG. 49 is a diagram showing the operating principle of the projection system according to an eighth embodiment of the invention.
Figure 50:
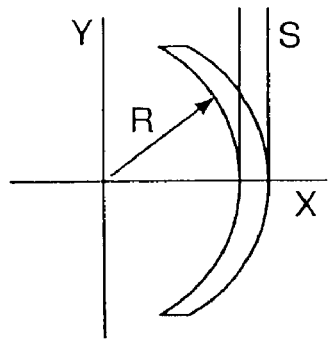
FIG. 50 is a diagram showing part of the ring-shaped exposure field of the eighth embodiment of the invention.

According to the eighth embodiment, the mask MA is placed inside a magnetic field, which converges towards a 16× stronger field at the wafer, W. Therefore electrons will approximately circle once around a field line and form a 4× demagnified mask image on the wafer. The most straight-forward magnetic field form for this purpose is the magnetic monopole or $1/z^2$ field as described in P. Kruit and M. Lenc, Journal of Applied Physics 72, 1992, pp.4505. This is shown in FIG. 49. A large ring shaped exposure field, shown in FIG. 50, can be created of e.g. 8 mm width when R=5 mm and S=0.2 mm. This is possible since all positions at the same radius from the optical axis suffer from the same aberrations.

The tilt angle of a beam is proportional to the field size. For instance, for a mask-wafer distance of 400 mm and radius of the annular exposure field of 5 mm at the wafer (20 mm at the reticle), the tilt angle 37.5 mrad. This means that telecentric landing is possible at the wafer but the angle at the reticle is 29 mrad (¾ of 37.5 mrad). This of course determines how well the reticle must be positioned. For a placement error of 10 nm at the wafer the position of the reticle has to be within less than 1.2 µm of its paraxial position along the optical axis.

It can be proven that if the tilt angle of the beam is 0 with respect to the field lines, all distortions are zero.

Figure 51:
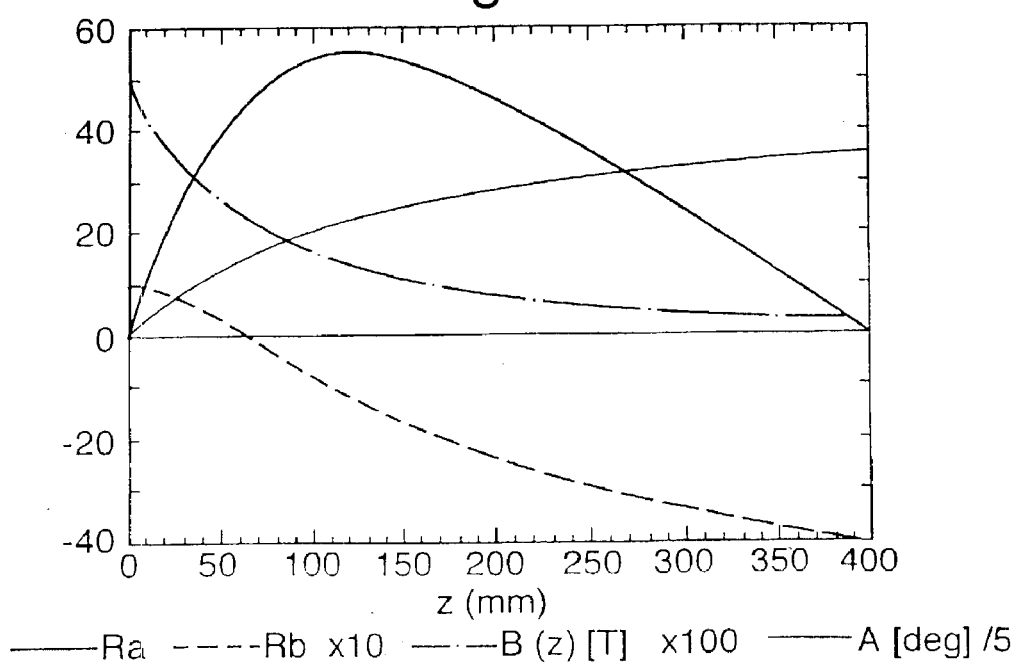
FIG. 51 is a graph of properties of the magnetic monopole lens of the eighth embodiment of the invention.

To calculate the geometrical optical performance of this type of projection system for vertical landing on the wafer it is simulated using the program MLD (Magnetic Lens Design). FIG. 51 shows some of the results. In FIG. 51 z=0 mm corresponds with the wafer plane while z=400 mm corresponds with the reticle plane. The magnetic field strength at the position of reticle and wafer is 0.031 T and 0.5 T respectively.

The table below gives some aberration coefficients of the magnetic monopole lens.

TABLE 5

|  |  | Isotropic (real part) | Anisotropic (imag. Part) |
|---|---|---|---|
| Spherical ab. [mm] | $C_s$ | 22.6 |  |
| Coma length [–] | $C_{col}$ | –0.339 | 1.42 |
| Field curv. [mm$^{-1}$] | $C_{fc}$ | 0.0443 |  |
| Astigmatism [mm$^{-1}$] | $C_{as}$ | –0.0210 | –0.0106 |
| Distortion [mm$^{-2}$] | $C_{di}$ | –1.56 10$^{-4}$ | 6.52 10$^{-4}$ |
| Axial chrom. [mm] | $C_{as}$ | 50.0 |  |
| Transverse chrom. [–] | $C_{tc}$ | 0.375 | –1.57 |

With the coefficients in the above table the aberration blur in the annular field can be calculated:

$$d_{fc} = C_{fc} \cdot F^2 \cdot \sigma = C_{fc} \cdot (R+S)^2 \cdot \sigma = C_{fc} \cdot (R^2 + 2 \cdot R \cdot S + S^2) \cdot \sigma \quad (15)$$

$$d_{di} = C_{di} \cdot F^3 = C_{di} \cdot (R+S)^3 = C_{di} \cdot (R^3 + 3 \cdot R^2 \cdot S + 3 \cdot R \cdot S^2 + S^3) \quad (16)$$

The first terms within brackets are constant over the annular exposure fields and can be corrected. Therefore the most significant contributions are:

$$d_{fc} = 2 \cdot C_{fc} \cdot R \cdot S \cdot \sigma \quad (17)$$

$$d_{di} = 3 \cdot C_{di} \cdot R^2 \cdot S \quad (18)$$

The eighth embodiment is advantageous in not requiring dynamic deflectors. In the eighth embodiment, which uses a magnetic monopole, the landing at both mask and wafer can be vertical.

Embodiment 9

The ninth embodiment, which maybe the same as embodiments described above save as described below, also decreases the influence of Coulomb interaction in a system with a small convergence angle.

Figure 52:
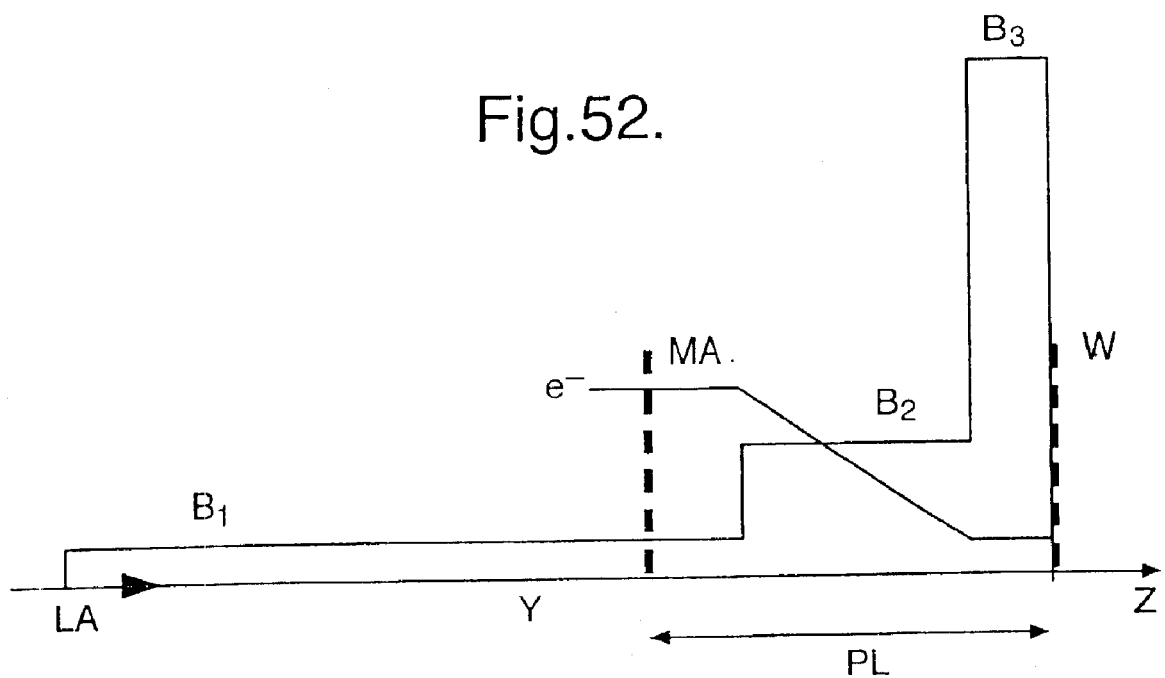
FIG. 52 is a graph of field strengths in the projection system of lithographic apparatus according to a ninth embodiment of the invention.
Figure 53:
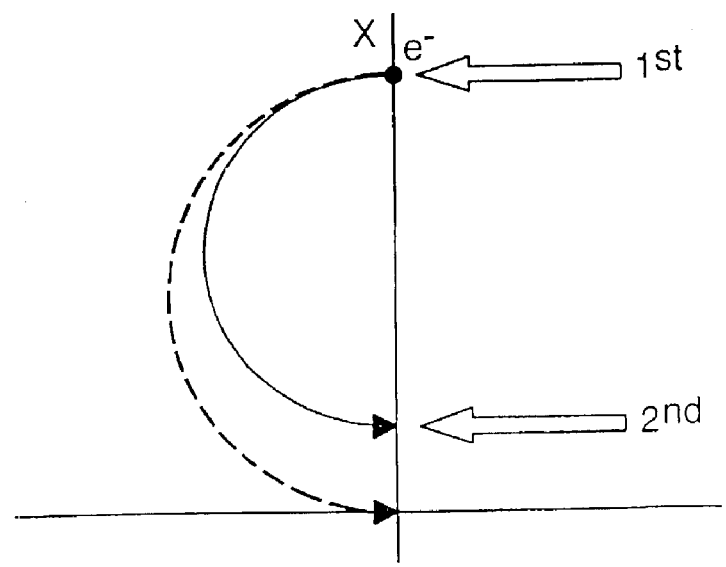
FIG. 53 is a diagram showing particle trajectories in the projection systems of a known e-beam lithography apparatus and the lithography apparatus of the ninth embodiment of the invention.

In the ninth embodiment, the mask is again placed inside a magnetic field, which converges towards a 16× stronger field at the wafer so that electrons will approximately circle once around a field line and form a 4× demagnified mask image on the wafer. By placing one or more apertures around the beam, scattering contrast will arise. Because there is no cross-over, the numerical aperture can be very small, and thus the field can be large. There is no need for predistorted masks. The electron source is in a magnetic field. The arrangement of fields is shown in FIG. 52 and the resultant electron trajectory (solid line) is shown in FIG. 53 compared to the trajectory in a conventional lens (dashed line).

In the ninth embodiment, for a 400 mm reticle to wafer distance, the reticle is placed in a homogeneous magnetic field of 2.8 10$^{-3}$ T. After 160 mm the field increases to 1.1 10$^{-2}$ T in a substantially stepwise fashion. In this field, the electrons make half a circle, going ¾ of the way towards the axis. At 360 mm from the mask, the field increases to 4.5 10$^{-2}$ T, again substantially stepwise. This stops the electrons from spiraling, and they go straight towards the wafer where they land vertically. The second field jump acts almost as a negative electron lens. The beam is never smaller than the field at the wafer, so the space charge effects are reduced. The one aberration that is introduced is a chromatic rotation error. When an off-axis subfield is illuminated, deflector and corrector fields can keep the beam on a "curvilinear" axis, and the vertical landing can be maintained. However, the beam never comes on the axis of the system, so the contrast aperture must be dynamic in its position. There are several methods to realize this:

The contrast aperture can be a light construction and the position accuracy is not very high so a mechanical movement is can be arranged. For 1×1 mm$^2$ fields, at 40 WPH the movement must be 8 mm in about 10 msec, so that is about 1 m/sec.

The writing strategy can be ordered such that the aperture does not need to turn around. Then a series of apertures can be provided on a rotating disk. If turn around is necessary, two disks with apertures, rotating in opposite directions, can be used.

The contrast aperture can be a slit.

The optical properties of this concept have been calculated with the programmed MLD (Magnetic Lens Design). Results are shown in the table below and FIGS. 54 and 55.

TABLE 6

|  |  | Conventional system | | Ninth Embodiment | |
|---|---|---|---|---|---|
|  |  | Isotropic (real part) | Anisotropic (imag. Part) | Isotropic (real part) | Anisotropic (imag. Part) |
| Spherical ab. [mm] | $C_s$ | 114 |  | 13.5 |  |
| Coma length [–] | $C_{col}$ | –3.84 | –1.63 | 0.449 | 1.29 |
| Field curv. [mm$^{-1}$] | $C_{fc}$ | 0.144 |  | 0.108 |  |
| Astigmatism [mm$^{-1}$] | $C_{as}$ | 0.0364 | 0.0394 | –0.0134 | 0.0246 |
| Distortion [mm$^{-2}$] | $C_{di}$ | 1.20 10$^{-5}$ | 1.12 10$^{-5}$ | 2.04 10$^{-3}$ | 2.38 10$^{-3}$ |
| Axial chrom. [mm] | $C_{as}$ | 45.2 |  | 31.2 |  |
| Transverse chrom. [–] | $C_{tc}$ | –6.61 10$^{-3}$ | –1.49 10$^{-3}$ | –1.13 | –1.66 |

The above table shows that most of the aberration coefficients in the ninth embodiment are comparable to those in a conventional system. There is only one exception: the transverse chromatic aberration. This blur contribution can be improved if energy losses in the mask are reduced.

Figure 54:
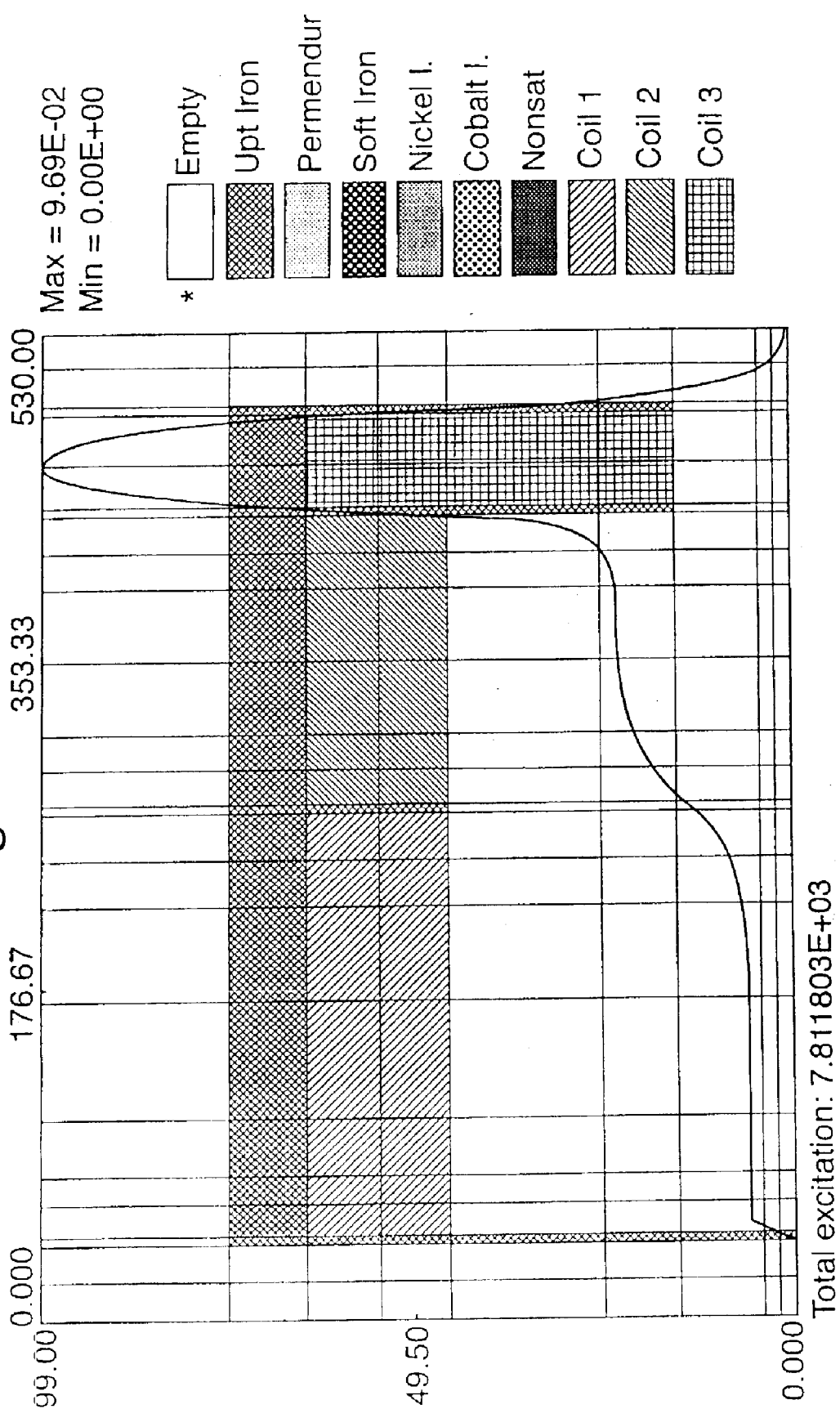
FIG. 54 is a diagram of the magnetic lens layout and field strengths in the projection system of the ninth embodiment of the invention.
Figure 55:
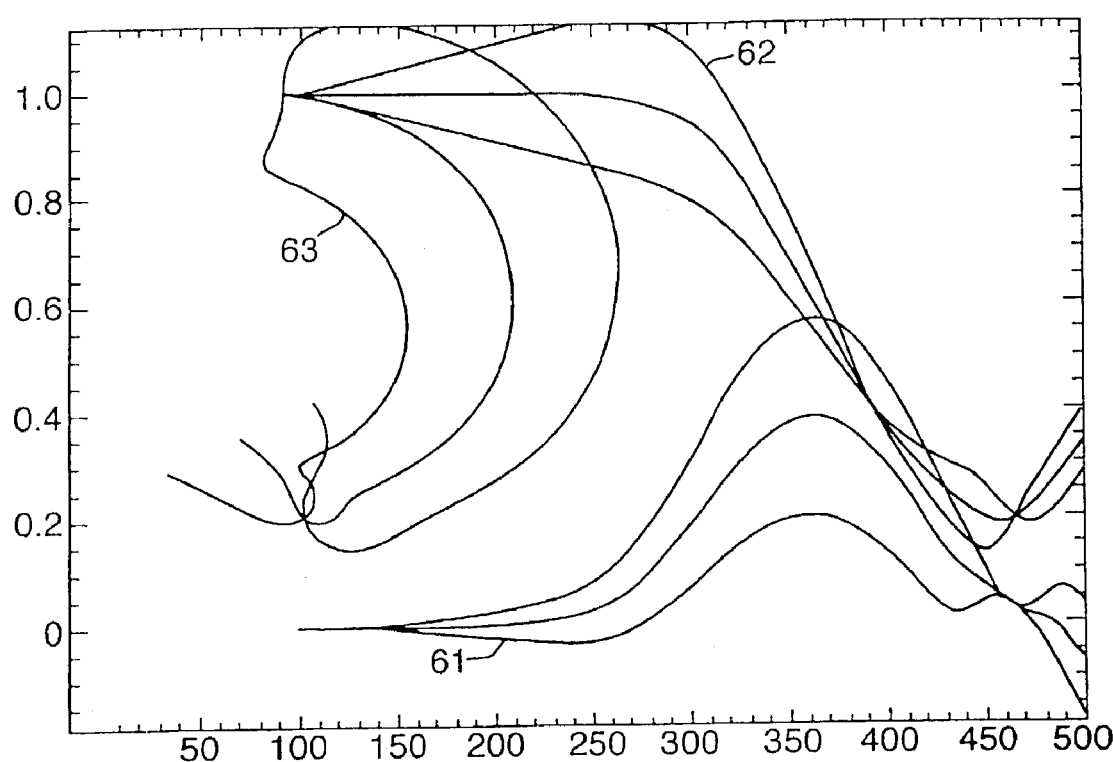
FIG. 55 is a diagram of particle trajectories in the projection system of the ninth embodiment of the invention.

FIG. 54 shows the lens layout and magnetic field strengths in the ninth embodiment while FIG. 55 shows electron beam rays. Curves 61 and 62 show the rays in XZ and YZ plane respectively. Curve 63 show the rays in the XY plane.

It should be noted that the tenth embodiment can be combined, to especial advantage, with the sliding lens concept of the fourth to sixth embodiments of the invention to improve the effective field to a full die.

Embodiment 10

Figure 56:
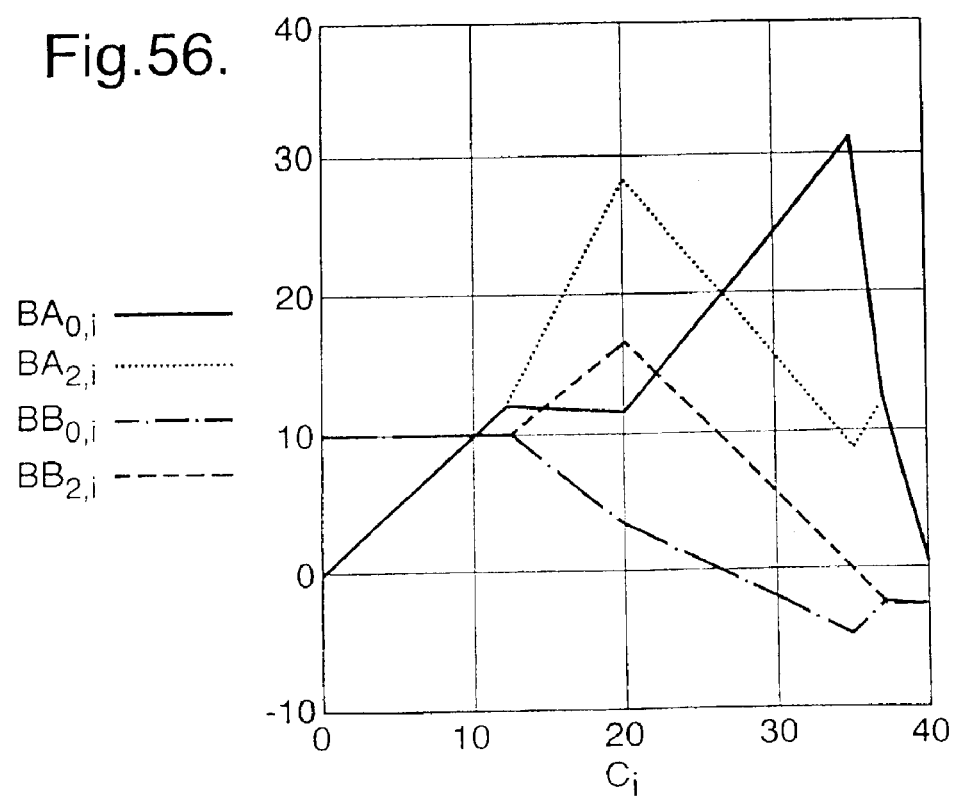
FIG. 56 is a diagram of principle rays in the projection system of a lithography apparatus according to a tenth embodiment of the invention.

In a tenth embodiment of the invention, which maybe the same as embodiments described above save as described below, an astigmatic cross-over is provided by replacing the conventional magnetic doublet with two round (spherical) lenses. Constraints such as equal magnification (M=0.25) in both perpendicular directions and telecentricity at reticle and wafer can be fulfilled, as shown in FIG. 56. Considering only the central rays, the cross-over changes in the tenth embodiment from a point into a set of two cross-over lines with a circle of least confusion in between. Especially for a system with a small opening angle the Coulomb interaction "hot spot" will be more distributed. This is advantageous if the small convergence angle is combined with a large exposure field of 1×1 mm² at the wafer.

FIG. 56 shows principle rays for a system with 4 quadrupoles, telecentric and with magnification 0.25. The rays with different first suffix describe the beam in two perpendicular directions. The dotted lines start nominal to the reticle at the edge of the exposure field; the continuous lines start with a certain opening angle on axis.

The above system was modeled in POCAD for an aberration-free (ideal) system with a source R=0.75 mm (exposure field 0.25×0.25 mm²) and an opening angle of α=0.75 mrad (3mrad at wafer level). Due to rounding errors a point on the reticle was imaged as a spot with a 7.5 nm diameter. If we add aberrations according to an optimistic estimate $C_s=f$ for quadrupole elements, aberrations in the corner field are on the order of microns.

For the quadrupole a much smaller opening angle is envisioned. The aberration-free projection system was modeled at α=0.075 mrad (reticle level), or 0.3 mrad (wafer level). The imaging at the desired magnification occurs perfectly for this ideal system. The disc of blur size is less than 0.4 nm for all field coordinates. No exact point focus is found due to rounding errors. Thus, the POCAD model works. After adding a spherical aberration equal to $C_s=1/S=f$ (optimistic minimum estimation) to all quadrupole elements, discs of blur occur of order 100 nm diameter.

Figure 57:
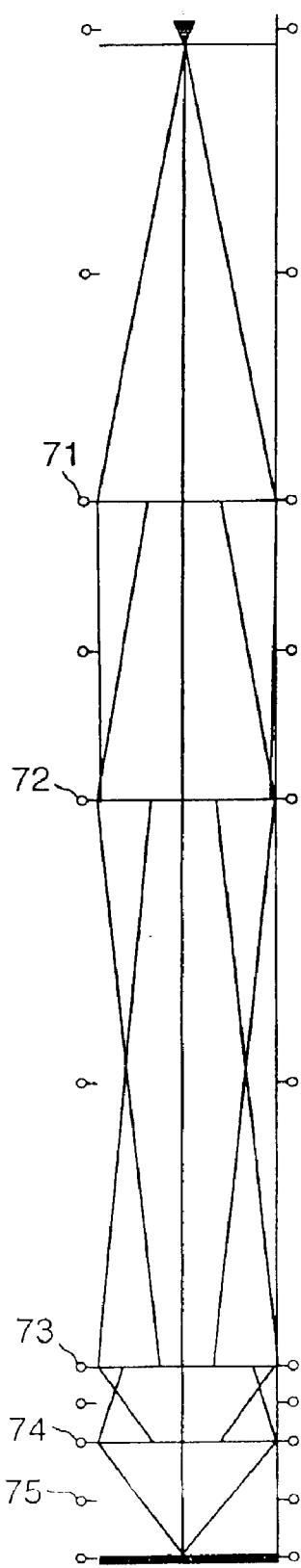
FIG. 57 is a diagram of the projection system of the tenth embodiment of the invention.

The modeled system is shown in FIG. 57 in which the four quadrupoles are 71, 72, 73 and 74. 75 is the wafer. With a simple ray-trace program, the landing positions have been calculated for rays emitted at (the expected) various angles (in one direction only for points at the reticle edge but not the corner). The results are listed in the table below, which gives coordinates of two series of 10 rays. The two sets of rays originate from a field position (x=2 mm, y=0 mm), respectively from (x=0 mm, y=2 mm) and are emitted at angle α=arc tan x' and β=arc tan y' ranging from 0–0.075 mrad at the reticle.

TABLE 7

| | |
|---|---|
| X end: −0.497464 mm | Angle end: 0.05 mrad |
| X end: −0.497484 mm | Angle end: 0.02 mrad |
| X end: −0.497505 mm | Angle end: −0.01 mrad |
| X end: −0.497526 mm | Angle end: −0.04 mrad |
| X end: −0.497546 mm | Angle end: −0.07 mrad |
| X end: −0.497566 mm | Angle end: −0.10 mrad |
| X end: −0.497586 mm | Angle end: −0.13 mrad |
| X end: −0.497606 mm | Angle end: −0.16 mrad |
| X end: −0.497626 mm | Angle end: −0.19 mrad |
| X end: −0.497646 mm | Angle end: −0.22 mrad |
| Y end: −0.504002 mm | Angle end: 0.40 mrad |
| Y end: −0.504012 mm | Angle end: 0.37 mrad |
| Y end: −0.504023 mm | Angle end: 0.34 mrad |
| Y end: −0.504034 mm | Angle end: 0.31 mrad |
| Y end: −0.504045 mm | Angle end: 0.28 mrad |
| Y end: −0.504056 mm | Angle end: 0.25 mrad |

TABLE 7-continued

| | |
|---|---|
| Y end: −0.504067 mm | Angle end: 0.22 mrad |
| Y end: −0.504078 mm | Angle end: 0.20 mrad |
| Y end: −0.504088 mm | Angle end: 0.17 mrad |
| Y end: −0.504099 mm | Angle end: 0.14 mrad |

It can be concluded that the landing position is about 4 µm off, but the difference for all rays is only about 182 nm (x-direction) and 100 nm (y-direction). These numbers suggest a large distortion and some other aberrations, of which the worst can be compensated. Therefore it is concluded that a projection system based on quadrupoles is possible, according to an analytical model. Initial results indicate large distortion, which can be corrected in the mask but reasonable other aberrations, at 1×1 mm² exposure field and 0.3 mrad convergence angle.

The stochastic Coulomb interactions are equivalent to a cross-over diameter of about half the size of the disk in between the line cross-overs independent of the convergence angle.

The concept of a quadrupole system can be combined with a slider lens, as described in relation to the fourth to sixth embodiments as described above, to improve the effective field to a full die. The slider lens now has to be a quadrupole lens. This is obtained with the design as described above by removing the field of the slit lens.

In a variation of the tenth embodiment, instead of using two times two quadrupoles to make an asymmetric doublet also two (anti-symmetric) quadrupole triplets can be used. The triples will effectively act as round lenses. This means that there will be no astigmatic cross-over. However, the beam paths through the system will, just as in a regular doublet, be (anti-) symmetric with respect to the contrast aperture. This means that the aberration compensation will be better. Since there will be no rotation in the beam path there will be no an-isotropic aberrations. This means that after correction of the field curvature using an electrostatic field at the reticle less aberrations will be present. This will allow for more beam current. Compensation of the curvature of field is possible as there is an electric field at the reticle. With the correction of field curvature and an increased shot field size the beam current will be higher than for a comparable round lens based doublet system.

Embodiment 11

Figure 58:
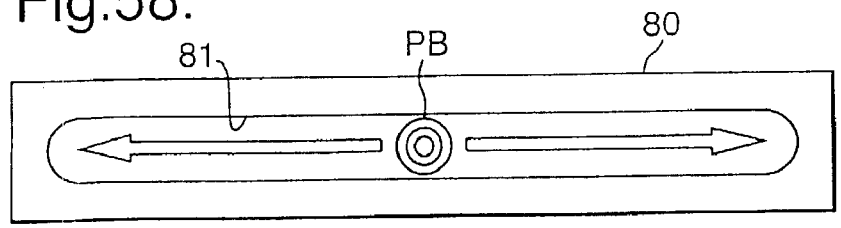
FIG. 58 is a diagram of a single beam in a single slit slider lens.

The eleventh embodiment is a variation of the slider concept of the fourth to sixth embodiments described above. FIG. 58 is a cross-sectional view of the slider concept showing projection beam PB and its scanning motion, indicated by arrows, in the slit 81 in the slider lens 80. In the tenth embodiment the fact that the effective field size of the slider concept is large as compared to the shot size is used to enable provision of a second beam inside the system. The two beams will be relatively far apart inside the system except in the cross-over region. Coulomb interactions outside the cross-over region are negligible. Since this region is short compared to the total beam path, the Coulomb interactions are less than for a single beam system with double current. This means that the total beam current can be substantially more than twice the single beam current. Also the stochastic part of the blur will increase because this is mainly generated in the crossover region. The global space charge blur is not expected to increase very much because this is mainly generated in the regions outside the cross-over.

Figure 59:
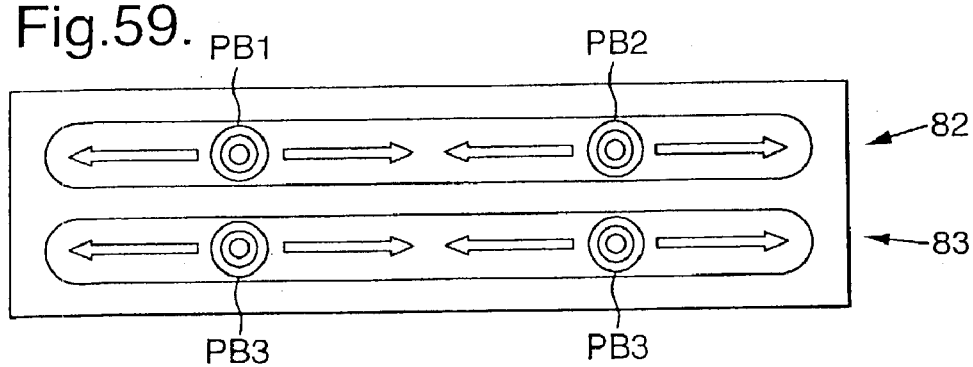
FIG. 59 is a diagram showing multiple beams in multiple slits in a slider lens in the projection system of a lithographic apparatus according to an eleventh embodiment of the invention.

Besides using two beams in one slider lens it is also possible to combine two lenses 82, 83 side by side as shown in FIG. 59. These beamlets PB1, PB2, PB3 and PB4 can print different exposure fields in one die. But it is also possible to print on several dies: a minimum deflection is required when an array of e.g. 16 beamlets is printing on 4×4 dies.

Figure 60:
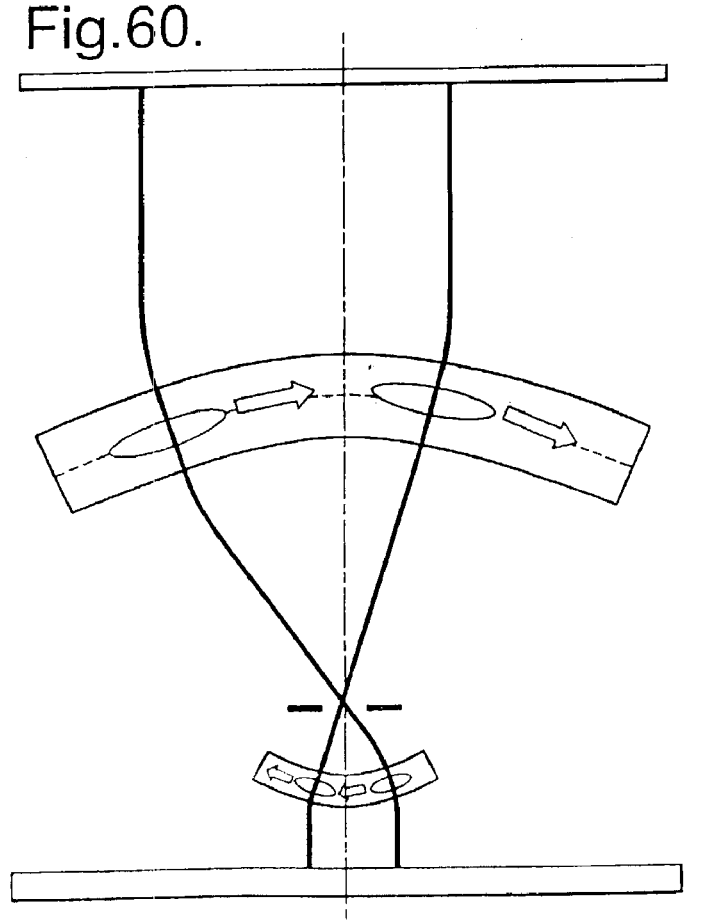
FIG. 60 is a diagram of the projection system of the eleventh embodiment of the invention.
Figure 61:
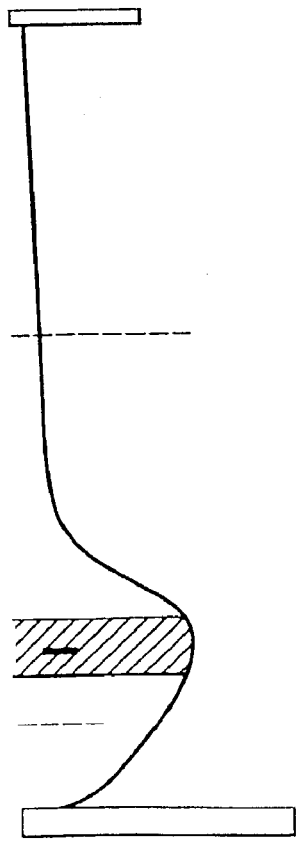
FIG. 61 is a diagram of Coulomb forces acting on the beam in eleventh embodiment of the invention.

FIG. 60 shows a slider lens system with multiple beams. FIG. 61 shows Coulomb forces in a single beam vs. a multiple beam system. In the slider system with multiple beams there is only a small part of the trajectory where both beams overlap, the diagonally hatched area in FIG. 61. Since these beamlets only interfere in a very small area, the Coulomb interaction scales with a lower power of the beam current. Therefore more current can pass through the projection system than with a single beam at equal Coulomb interaction blur. Even printing at several dies simultaneously is possible with this concept. This reduces the heating of the wafer.

Figure 62:
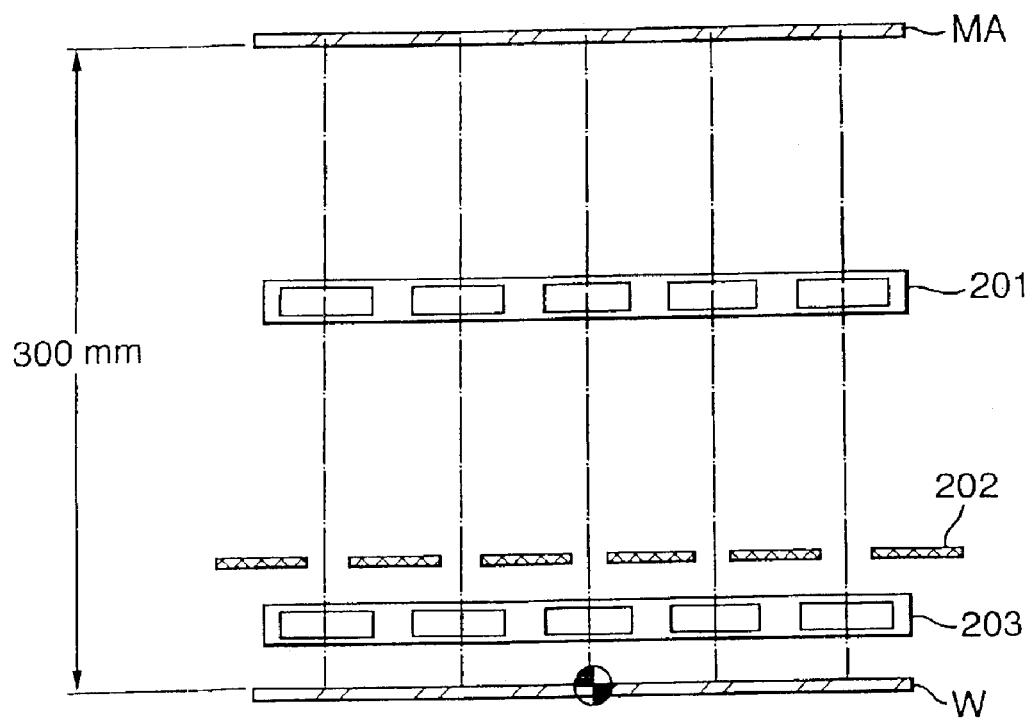
FIGS. 62 to 64 are diagrams of first to third variants of the eleventh embodiment.

FIG. 62 shows the projection system of a first variant of the eleventh embodiment. In this variant, five beamlets are focused on the substrate W by respective scanning electron-optical systems 201, 203 passing through respective apparatus 202. Each electron-optical system is constructed as in FIG. 44.

Several beamlets are combined in a single slider system while they are writing on individual dies. Numbering the beamlets 1 to 5 from left to right, the writing strategy can be explained as follows:

In each mechanical scan a full die is exposed. However, stripe 1 is exposed on die 1, stripe 2 on die 2 etc.
The wafer stage is now moved to the next die position. Stripe 1 is now exposed on die 2, stripe 2 on die 3 etc.
The wafer stage is now moved to the next die position. Stripe 1 is now exposed to die 3, stripe 2 to die 4 etc.
In this way full dies are exposed.

The distance between the beamlets depends on the die size. Therefore also the aperture array has to be changed for another die size.

The optical axis for each beamlet is straight. This means that the beamlets are combined without additional deflection. The deflectors shown in FIG. 44 are used to expose an effective field of e.g. ⅕ of the die size.

For calibration purposes of rotation and magnification an element like the Waskotron (a device used to correct the size and/or rotational offset of an electric field/image at substrate level conceived by Mr Waskiewicz) can be positioned around the aperture for each beamlet. This system can provide adjustable focal length in the quadrupole set. This is possible since all components act only locally for a certain beamlet. Alternatively, a large depth of focus such that adjustment is not necessary given a certain fabrication tolerance for mechanics and electronics, can be used.

This system provides equal focal length for each beamlet since the optical axis of each beamlet is straight. Also, rotation and magnification correctors can be positioned in cross-over at aperture plane.

Figure 63:
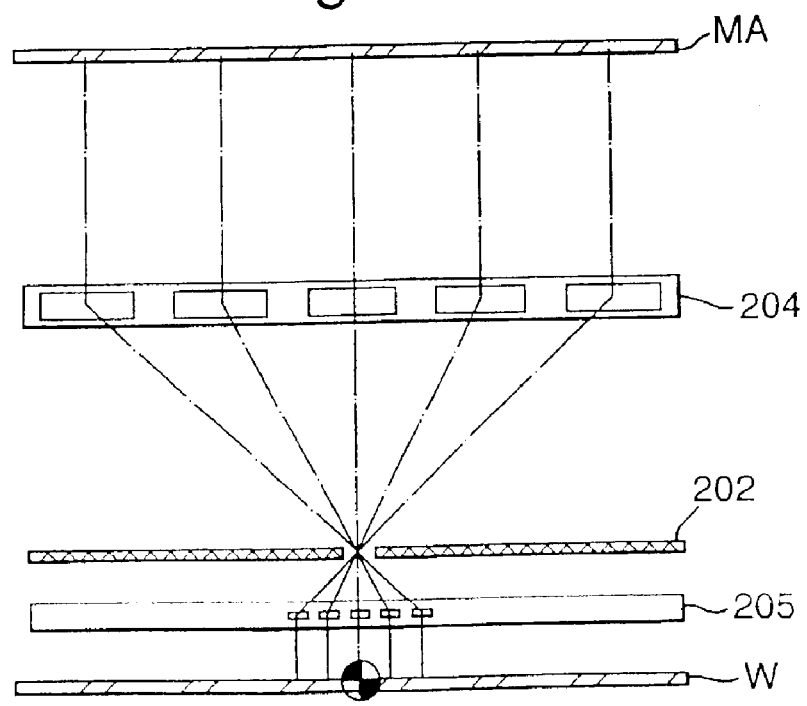

The projection system of a second variant of the eleventh embodiment is shown in FIG. 63. In this variant optical systems 204, 205 as shown in FIG. 44 are again used but the beamlet deflections are arranged so that there is a common cross-over in aperture 202.

With this arrangement several beamlets are combined in a single system while they are writing on the same die. The result is that a single mechanical scan suffices to expose a full die. The common cross-over will give additional Coulomb interactions. The beamlets cannot be considered as independent. The distance between the beamlets depends on the die size. But this has no consequences for the aperture. The optical axis for each beamlet is bent significantly. This means that the beamlets are combined with additional deflection resulting in larger deflection aberrations.

The advantage of this arrangement is that writing of a complete die during a single mechanical scan is equal to current optical scanners. However, there is a different focal length for each beamlet since the optical axis of each beamlet is bent. Also, rotation and magnification correctors cannot be positioned in the cross-overs at the aperture plane since all beams interfere and Coulomb interaction is larger than in the case of separated beamlets. Furthermore the packing density of beamlets increases with decreasing die size and static deflection angles are large (0.4 rad).

Figure 64:
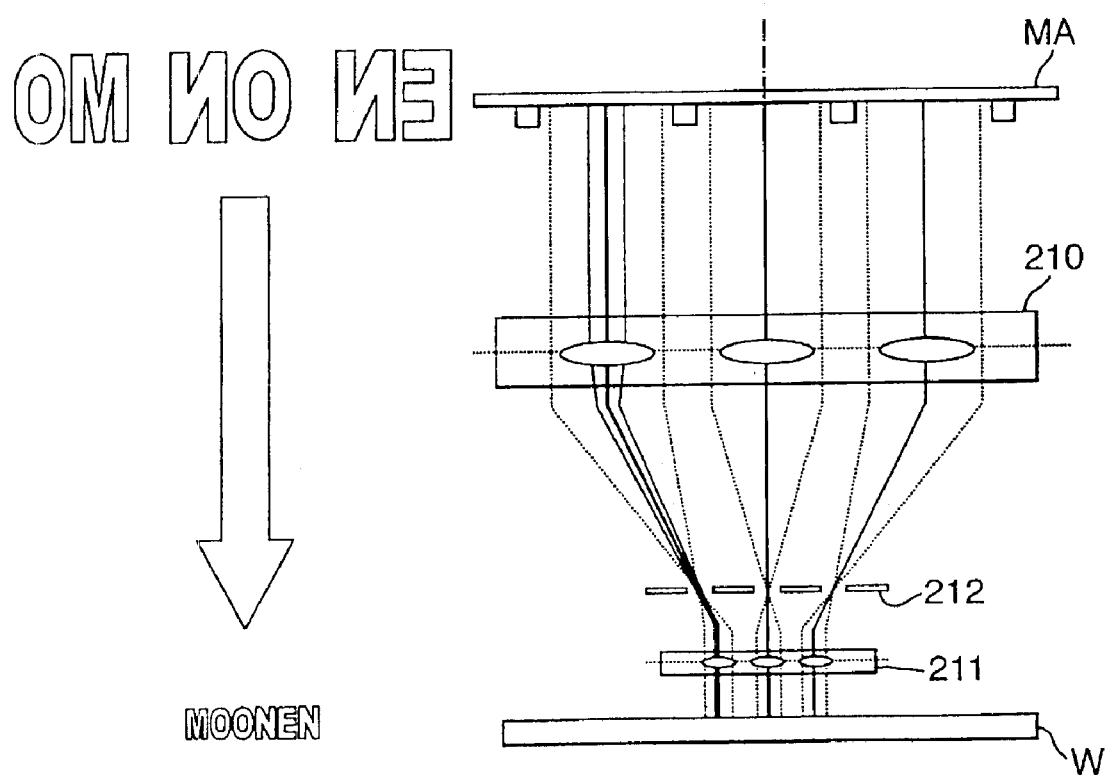

The third variant of the eleventh embodiment, the projection system of which is shown in FIG. 64, utilises separate cross-overs for each beamlet but all beamlets write on the same die. Again, the electron-optical systems 210, 211 are as in FIG. 44 but with deflection angles set to bring the beamlet onto a single die via separate cross-overs in aperture 212.

Thus, several beamlets are combined in a single slider system while they are writing on the same die. The result is that a single mechanical scan suffices to expose a full die. The pattern on the reticle consists of stripes separated by struts. The pattern of each stripe is mirrored in the optical axis of the beamlet. An example is shown in FIG. 64.

The distance between the beamlets depends on the die size. Therefore also the aperture array has to be changed for another die size. The beamlets are completely separated giving minimal Coulomb interaction. The optical axis for each beamlet is bent significantly. This means that the beamlets are combined with additional deflections resulting in larger deflection aberrations.

This variant has advantages that writing of a complete die during a single mechanical scan is equal to current optical scanners. Also, rotation and magnification correctors can be positioned in the cross-overs at the aperture plane, and Coulomb interaction is minimal due to separated beamlets. However, there is a different focal length for each beamlet since the optical axis of each beamlet is bent. Also, the position of apertures is die size dependent, the packing density of beamlets increases with decreasing die size, and static deflection angles are large (0.12 rad).

While we have described above specific embodiments of the invention it will be appreciated that the invention may be practiced otherwise than described. The description is not intended to limit the invention.

What is claimed is:

1. A method of manufacturing a device using a lithographic apparatus, comprising:
   providing a substrate which is at least partially covered by a layer of energy-sensitive material;
   generating an electromagnetic field to act upon a projection beam generated by said lithographic apparatus, wherein an optical axis of said electromagnetic field is displaced by an action of a multipole magnetic field in at least one direction perpendicular to said optical axis in synchronism with a scanning motion of the lithographic apparatus; and
   irradiating portions of said layer of energy-sensitive material with a projection beam of radiation which has been affected by said displaced optical axis of said electromagnetic field.

2. A method in accordance with claim 1, wherein said optical axis of said electromagnetic field is displaced by an action of at least one quadrupole magnetic field which acts substantially perpendicularly to a stationary magnetic field.

3. A method in accordance with claim 1, wherein an array of selectable coils are provided, arranged in pairs on opposite sides of a space through which a projection beam is scanned, to generate at least one quadrupole field, and where individual pairs of said selectable coils are selectively energized to displace said optical axis.

4. A method in accordance with claim 3, wherein two groups of selectable coils, each group comprising at least one pair of coils, are simultaneously energized to form a field having an axis at a position between two pairs of coils.

5. A method in accordance with claim 1, wherein an electron-optical element comprising two arrays of selectable coils, arranged in lines on opposite sides of space through which a projection beam is scanned, are used in combination with conductors to generate a magnetic field in a plane perpendicular to a direction of propagation of said projection beam, and wherein said coils are selectively energized to form the multipole field at an arbitrary position in space, which multipole field acts as a beam deflector.

6. A method of manufacturing a device by employing a lithographic apparatus including a sliding electron-optical element, said method comprising:

providing a projection beam of radiation;

generating a multipole electromagnetic field using said sliding electron-optical element, to displace an optical axis of said projection beam by acting upon said projection beam from at least one direction perpendicular to said optical axis of said beam, in synchronism with a scanning action of said lithographic apparatus; and projecting at least a portion of said beam which has passed through said electromagnetic field onto a target portion of a substrate.

7. A method in accordance with claim 6, wherein said sliding electron-optical element employs a magnetic lens formed by a sum of a magnetic field operating substantially parallel to said optical axis and a quadrupole magnetic field operating substantially perpendicular to said optical axis.

8. A method in accordance with claim 7 wherein said magnetic field substantially parallel to said axis is stationary and said quadrupole magnetic field is displaced in synchronism with said scanning action.

9. A method in accordance with claim 8, wherein said sliding electron-optical element employs a pair of slit coils provided with yokes to generate said magnetic field substantially parallel to said axis, and employs an array of selectable coils, arranged in pairs on opposite sides of the space through which said projection beam is scanned, to generate said quadrupole field, said pair of slit coils being static and individual pairs of said selectable coils being selectively energized to displace an axis of said magnetic lens.

10. A method in accordance with claim 9, wherein two groups of said selectable coils, each group comprising at least one pair of coils, are simultaneously energized to form a field having an axis at a position between two pairs of coils.

11. A method in accordance with claim 9, wherein each of said selectable coils comprise first and second parts spaced apart in a direction parallel to the direction of propagation of said projection beam, and wherein said first and second parts are energized separately.

12. A method in accordance with claim 6, wherein said electron-optical element comprises two arrays of selectable coils arranged in lines on opposite sides of a space through which said projection beam is scanned and having conductors which generate a magnetic field in a plane perpendicular to a direction of propagation of said projection beam, wherein said coils are selectively energized to form a deflector, the multipole field, or both, at an arbitrary position in space.

13. A method in accordance with claim 6, wherein said electron-optical element is displaced physically in synchronism with said scanning action.

14. A method in accordance with claim 6, wherein said electron-optical element is displaced electronically in synchronism with said scanning action.

15. A method in accordance with claim 6, wherein said projection system comprises two sliding electron-optical elements functioning as lenses.

16. A method in accordance with claim 15, wherein one of said sliding electron-optical elements is arranged on an object side and another of said sliding electron-optical elements is arranged on a image side of a beam cross-over.

17. A method in accordance with claim 6, wherein said sliding electron-optical element is arranged to displace said optical axis along a substantially linear path substantially perpendicular to the axis of said projection beam.

18. A method in accordance with claim 6, wherein said sliding electron-optical element is arranged to displace said optical axis along a substantially arcuate path.

19. A method in accordance with claim 18, further comprising additional electromagnets before and after said sliding optical element to deflect said projection beam.

20. A method according to claim 6, comprising generating a plurality of projection beams which are spaced apart and scanned simultaneously.

21. A method according to claim 20, wherein one or more of said projection beams is scanned along each of a plurality of substantially parallel slots.

* * * * *